United States Patent
Tokunaga et al.

(10) Patent No.: US 11,798,810 B2
(45) Date of Patent: Oct. 24, 2023

(54) RESIST UNDERLAYER FILM-FORMING COMPOSITION CONTAINING AMIDE SOLVENT

(71) Applicant: NISSAN CHEMICAL CORPORATION, Tokyo (JP)

(72) Inventors: Hikaru Tokunaga, Toyama (JP); Satoshi Hamada, Funabashi (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/476,227

(22) PCT Filed: Jan. 9, 2018

(86) PCT No.: PCT/JP2018/000189
§ 371 (c)(1),
(2) Date: Jul. 5, 2019

(87) PCT Pub. No.: WO2018/131562
PCT Pub. Date: Jul. 19, 2018

(65) Prior Publication Data
US 2019/0354018 A1    Nov. 21, 2019

(30) Foreign Application Priority Data

Jan. 13, 2017 (JP) .................................. 2017-004033
Jul. 19, 2017 (JP) .................................. 2017-140193

(51) Int. Cl.
*H01L 21/308* (2006.01)
*H01L 21/027* (2006.01)
*H01L 21/311* (2006.01)

(52) U.S. Cl.
CPC ...... *H01L 21/3081* (2013.01); *H01L 21/0274* (2013.01); *H01L 21/0277* (2013.01); *H01L 21/3086* (2013.01); *H01L 21/31144* (2013.01)

(58) Field of Classification Search
CPC ............. H01L 21/0274; H01L 21/3081; H01L 21/3086; C08G 12/34; G03F 7/0042; G03F 7/0045
See application file for complete search history.

(56) References Cited

U.S. PATENT DOCUMENTS

| | | | |
|---|---|---|---|
| 2006/0154181 A1* | 7/2006 | Hada ........................ | G03F 7/40 430/322 |
| 2006/0160322 A1* | 7/2006 | Buehrer ............ | H01L 21/76232 438/424 |

(Continued)

FOREIGN PATENT DOCUMENTS

| CN | 103946271 A | 7/2014 |
|---|---|---|
| CN | 105143979 A | 12/2015 |

(Continued)

OTHER PUBLICATIONS

NIH PubChem Compound information for propanamide, 3-methoxy-N,N-dimethyl—(2022) (retrieved from https://pubchem.ncbi.nlm.nih.gov/) (Year: 2022).*

(Continued)

*Primary Examiner* — Michele Fan
(74) *Attorney, Agent, or Firm* — Oliff PLC

(57) ABSTRACT

A resist underlayer film-forming composition exhibiting high etching resistance, high heat resistance, and excellent coatability; a resist underlayer film obtained using the resist underlayer film-forming composition and a method for producing the same; a method for forming a resist pattern; and a method for producing a semiconductor device. A resist (Continued)

underlayer film-forming composition including a polymer and a compound represented by Formula (1) as a solvent.

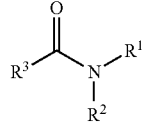

Formula (1)

In Formula (1), $R^1$, $R^2$, and $R^3$ in Formula (1) each independently represent a hydrogen atom or an alkyl group having 1 to 20 carbon atoms, which may be interrupted by an oxygen atom, a sulfur atom, or an amide bond, and $R^1$, $R^2$, and $R^3$ may be the same or different and may bond to each other to form a ring structure.

12 Claims, 1 Drawing Sheet

(56) References Cited

U.S. PATENT DOCUMENTS

| | | | |
|---|---|---|---|
| 2008/0029821 A1* | 2/2008 | Yamagami | H01L 21/823807 257/365 |
| 2013/0157196 A1 | 6/2013 | Nakasugi et al. | |
| 2013/0189533 A1 | 7/2013 | Okuyama et al. | |
| 2013/0341304 A1* | 12/2013 | Minegishi | G03F 7/09 216/47 |
| 2014/0235059 A1 | 8/2014 | Sakamoto et al. | |
| 2014/0374887 A1 | 12/2014 | Tamura et al. | |
| 2015/0090691 A1* | 4/2015 | Echigo | C07D 311/96 216/49 |
| 2016/0011512 A1 | 1/2016 | Nakafuji et al. | |
| 2016/0326396 A1 | 11/2016 | Nishimaki et al. | |
| 2018/0086886 A1 | 3/2018 | Sakamoto et al. | |
| 2018/0210341 A1* | 7/2018 | Echigo | C07C 69/54 |

FOREIGN PATENT DOCUMENTS

| | | | | |
|---|---|---|---|---|
| JP | 2003-345027 A | | 12/2003 | |
| JP | 2005-092014 A | | 4/2005 | |
| JP | 2010-217306 A | | 9/2010 | |
| JP | 2014-015507 A | | 1/2014 | |
| JP | 2015-507212 A | | 3/2015 | |
| JP | 2015-068855 A | | 4/2015 | |
| JP | 2015232688 A | * | 12/2015 | G03F 7/0045 |
| JP | 2016-146486 A | | 8/2016 | |
| TW | 201035702 A | | 10/2010 | |
| TW | 201538609 A | | 10/2015 | |
| WO | 2012/050064 A1 | | 4/2012 | |
| WO | WO-2013024779 A1 | * | 2/2013 | G03F 7/091 |
| WO | 2013/047516 A1 | | 4/2013 | |
| WO | 2014/156910 A1 | | 10/2014 | |
| WO | WO-2014171326 A1 | * | 10/2014 | C08G 61/02 |
| WO | WO-2015046332 A1 | * | 4/2015 | G03F 7/033 |
| WO | 2016/159358 A1 | | 10/2016 | |

OTHER PUBLICATIONS

Apr. 10, 2018 International Search Report issued in International Patent Application No. PCT/JP2018/000189.

* cited by examiner

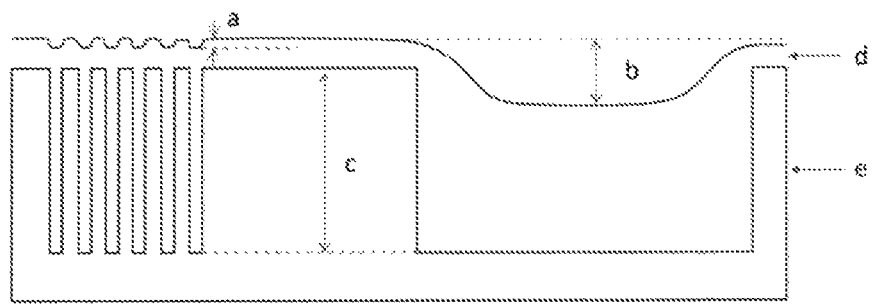

RESIST UNDERLAYER FILM-FORMING COMPOSITION CONTAINING AMIDE SOLVENT

TECHNICAL FIELD

The present invention relates to a resist underlayer film-forming composition exhibiting high etching resistance, high heat resistance, and excellent coatability; a resist underlayer film obtained using the resist underlayer film-forming composition and a method for producing the same; a method for forming a resist pattern; and a method for producing a semiconductor device.

BACKGROUND ART

In recent years, a high etching resistance and high heat resistance are strongly demanded as characteristics of resist underlayer films. It has been reported that an underlayer film produced from a resist underlayer film material for multilayer lithography process containing a phenylnaphthylamine novolac resin (Patent Literature 1) and an underlayer film produced from a resist underlayer film-forming composition for lithography containing a polymer containing a unit structure having an arylene group or a heterocyclic group (Patent Literature 2) have a heat resistance that allows formation of hardmasks on the underlayer films by vapor deposition and also exhibit advantageous effects as anti-reflective films.

CITATION LIST

Patent Literature

Patent Literature 1: WO 2013/047516
Patent Literature 2: WO 2012/050064

SUMMARY OF INVENTION

Technical Problem

From the perspectives of productivity and economical efficiency, a resist underlayer film-forming composition is preferably coated to form a film on a semiconductor substrate by using a spin coater. However, with such a coating-type resist underlayer film-forming composition, a polymer resin, a crosslinking agent, a crosslinking catalyst, and the like, which are the major components of the resist underlayer film-forming composition, need to be dissolved in an appropriate solvent to achieve excellent coatability. Representative examples of such a solvent include propylene glycol monomethyl ether (PGME), propylene glycol monomethyl ether acetate (PGMEA), cyclohexanone, and the like that are used in resist-forming compositions. The resist underlayer film-forming composition needs to have excellent solubility to these solvents.

Furthermore, a lithography process in which at least two layers of resist underlayer film are formed and are used as a mask material to decrease the film thickness of a resist layer required due to miniaturization of a resist pattern has been also known. This is a method in which at least one organic film (organic underlayer film) and at least one inorganic underlayer film are provided on a semiconductor substrate, a resist pattern formed on the upper layer resist film is used as a mask to pattern the inorganic underlayer film, and this pattern is used as a mask to pattern the organic underlayer film. It is reported that this method can form a pattern with a high aspect ratio. Examples of the materials for forming the at least two layers include combinations of an organic resin (e.g., acrylic resins and novolac resins) and an inorganic material (silicon resins (e.g., organopolysiloxane) and inorganic silicon compounds (e.g., SiON and $SiO_2$) and the like). Furthermore, in recent years, a double patterning technique, which performs lithography twice and etching twice to obtain a single pattern, has been widely applied, and in each of the steps, the multilayer process described above is used. At this time, the organic film formed after the formation of the first pattern is required to have step-planarizing property.

However, problems have arisen in that such a polymer that provides a resist underlayer film having a high etching resistance and high heat resistance has a limited solubility to the conventionally used solvents.

Furthermore, there are also problems in that a flat film is less likely to be formed, because such a resist underlayer film-forming composition has a low coatability to the so-called stepped substrate, in which a resist pattern formed on a substrate to be processed has difference in height and difference in density, and thus results in a larger difference in film thickness after the embedding.

The present invention was completed to solve the problems described above, and an object of the present invention is to provide a resist underlayer film-forming composition having a high etching resistance, high heat resistance, and excellent coatability. Furthermore, another object of the present invention is to provide a resist underlayer film obtained using the resist underlayer film-forming composition and a method for producing the same, a method for forming a resist pattern, and a method for producing a semiconductor device.

Solution to Problem

The present invention is to achieve the above-mentioned advantages by forming a resist underlayer film-forming composition by dissolving a polymer, which has a low solubility in the conventionally used solvents but has beneficial functions such as high etching resistance and high heat resistance, in a novel solvent that can be used for semiconductor device production, to produce a resist underlayer film using the resist underlayer film-forming composition.

The present invention embraces the following.

[1] A resist underlayer film-forming composition comprising a polymer and a compound represented by Formula (1) as a solvent.

[Formula 1]

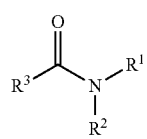

Formula (1)

wherein, $R^1$, $R^2$, and $R^3$ in Formula (1) each independently represent a hydrogen atom or an alkyl group having 1 to 20 carbon atoms, which may be interrupted by an oxygen atom, a sulfur atom, or an amide bond, and $R^1$, $R^2$, and $R^3$ may be the same or different and may bond to each other to form a ring structure.

[2] The composition according to [1], which contains from 5% by weight to 30% by weight of the compound represented by Formula (1) relative to a total weight of the composition.
[3] The composition according to [1] or [2], where the composition passes through a microfilter having a pore diameter of 0.1 μm.
[4] The composition according to any one of [1] to [3], where the polymer contains a structural unit represented by Formula (2).

[Formula 2]

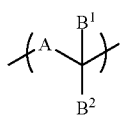

Formula (2)

wherein, in Formula (2), A represents a divalent group derived from an aromatic compound having 6 to 40 carbon atoms, in which a hydrogen atom of the aromatic compound having 6 to 40 carbon atoms may be replaced with an alkyl group having 1 to 20 carbon atoms, a condensed ring group, a heterocyclic group, a hydroxy group, an amino group, an ether group, an alkoxy group, a cyano group, a nitro group, or a carboxyl group; $B^1$ and $B^2$ are each selected from the group consisting of a hydrogen atom, an alkyl group having 1 to 20 carbon atoms, which may be interrupted by an oxygen atom or a sulfur atom, a heterocyclic group and an aryl group having 6 to 40 carbon atoms, of which a hydrogen atom may be substituted, and $B^1$ and $B^2$ may form a ring together with a carbon atom to which $B^1$ and $B^2$ are bonded.
[5] The composition according to any one of [1] to [3], where the polymer has a partial structure represented by Formula (3).

[Formula 3]

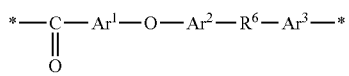

Formula (3)

wherein, $Ar^1$, $Ar^2$, and $Ar^3$ each represent an organic group containing a heterocyclic group or an arylene group having 6 to 50 carbon atoms; $R^6$ represents an unsubstituted or substituted alkylene group having 1 to 12 carbon atoms; and * is a site of bonding to another organic group.
[6] The composition according to any one of [1] to [3], where the polymer is derived from a bismaleimide compound.
[7] The composition according to [4], wherein A in Formula (2) is a divalent group derived from an arylamine compound having 6 to 40 carbon atoms.
[8] The composition according to [5], wherein $R^6$ in Formula (3) is represented by Formula (4).

[Formula 4]

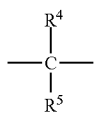

Formula (4)

wherein, $R^4$ and $R^5$ each independently represent
a hydrogen atom,
an alkyl group having 1 to 10 carbon atoms, which may be substituted by at least one substituent selected from the group consisting of a hydroxy group, an amino group, and halogen atoms,
an aryl group having 6 to 40 carbon atoms, which may be substituted by a hydroxy group, or
an aryl group having 6 to 40 carbon atoms, which may bond to another organic group through —O—,
$R^4$ and $R^5$ may bond to each other to form a cyclic structure, and
$R^4$ or $R^5$ may bond to any one of $Ar^1$, $Ar^2$, and $Ar^3$ to form a cyclic structure.
[9] The composition according to [6], wherein the polymer contains a unit structure represented by Formula (5) below.

[Formula 5]

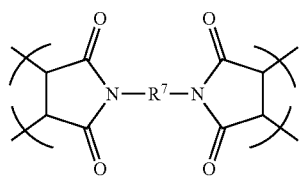

Formula (5)

wherein, $R^7$ in Formula (5) represents a divalent organic group.
[10] A method for producing a resist underlayer film, comprising the step of coating the resist underlayer film-forming composition according to any one of [1] to [9] on a semiconductor substrate and baking.
[11] A method for producing a semiconductor device, comprising the steps of: forming a resist underlayer film on a semiconductor substrate with the resist underlayer film-forming composition according to any one of [1] to [9]; forming a resist film thereon; forming a resist pattern by irradiation with light or electron beam and development; etching the underlayer film with the resist pattern; and processing the semiconductor substrate by the patterned underlayer film.
[12] A method for producing a semiconductor device, comprising the steps of: forming a resist underlayer film on a semiconductor substrate with the resist underlayer film-forming composition according to any one of [1] to [9]; forming an inorganic resist underlayer film thereon; forming a resist film further thereon; forming a resist pattern by irradiation with light or electron beam and development; etching the inorganic resist underlayer film with the resist pattern; etching the underlayer film by the patterned inorganic resist underlayer film; and processing the semiconductor substrate with the patterned resist underlayer film.
[13] The production method according to [12], wherein the step of forming the inorganic resist underlayer film is performed by vapor deposition of an inorganic substance.
[14] The method for producing the resist underlayer film according to [10], wherein the semiconductor substrate has a part having a step and a part having no step, and a step (iso-dense bias) between the resist underlayer film coated on the part having a step and the part having no step ranges from 3 to 50 nm.
[15] A resist underlayer film formed by coating the resist underlayer film-forming composition according to any one of [1] to [9] on a semiconductor substrate having a part having a step and a part having no step and baking, and having a step (iso-dense bias) between the part having a step and the part having no step of from 3 to 50 nm.

[16] A method for producing a resist pattern, comprising the steps of: forming a resist underlayer film on a semiconductor substrate with the resist underlayer film-forming composition according to any one of [1] to [9]; forming a resist film thereon; and forming a resist pattern by irradiation with light or electron beam and development.

[17] The composition according to any one of [1] to [9], further comprising a crosslinking agent.

[18] The composition according to any one of [1] to [9] and [17], further comprising an acid and/or an acid generating agent.

[19] Use of a compound represented by Formula (1) as a solvent for a resist underlayer film-forming composition.

[Formula 6]

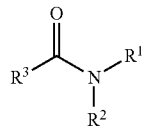

Formula (1)

wherein, $R^1$, $R^2$, and $R^3$ in Formula (1) each independently represent a hydrogen atom or an alkyl group having 1 to 20 carbon atoms, which may be interrupted by an oxygen atom, a sulfur atom, or an amide bond, and $R^1$, $R^2$, and $R^3$ may be the same or different and may bond to each other to form a ring structure.

[20] The composition according to any one of [1] to [9], [17] and [18], wherein the composition is for producing an underlayer film of an inorganic resist underlayer film.

[21] A method for producing a resist underlayer film comprising the step of forming an inorganic resist underlayer film after the production of the resist underlayer film according to [10].

[22] A resist underlayer film, which is a baked product of a coated film formed from the resist underlayer film-forming composition according to any one of [1] to [9], [17] and [18].

Advantageous Effects of Invention

The resist underlayer film material according to the present invention achieves excellent spin coatability due to high solubility as well as exhibits a high etching resistance and high heat resistance. The resulting resist underlayer film achieves excellent coatability relative to a so-called stepped substrate, achieves formation of a flat film with a small variation in film thickness after embedding, and enables finer substrate processing.

In particular, the resist underlayer film-forming composition according to the present invention is effective in a lithography process, in which, for the purpose of making the thickness of the resist film thin, at least two layers of resist underlayer film are formed and the resist underlayer film is used as an etching mask.

BRIEF DESCRIPTION OF DRAWINGS

FIG. 1 is a diagram explaining iso-dense bias. The iso-dense bias is (b-a) in FIG. 1.

DESCRIPTION OF EMBODIMENTS

1. Resist Underlayer Film-Forming Composition

The resist underlayer film-forming composition according to the present invention contains a polymer, a solvent, and other component(s), and will be described below.

1.1 Solvent

The resist underlayer film-forming composition according to the present invention is prepared by dissolving polymers described below in a specific solvent and is used in a state of a uniform solution.

1.1.1. Compound Represented by Formula (1)

The resist underlayer film-forming composition according to the present invention contains a compound represented by Formula (1) as a solvent.

[Formula 7]

wherein, $R^1$, $R^2$, and $R^3$ in Formula (1) each independently represent a hydrogen atom or an alkyl group having 1 to 20 carbon atoms, which may be interrupted by an oxygen atom, a sulfur atom, or an amide bond, and $R^1$, $R^2$, and $R^3$ may be the same or different and may bond to each other to form a ring structure.

Examples of the alkyl groups having 1 to 20 carbon atoms include straight or branched alkyl groups that may have a substituent or no substituent. Examples thereof include a methyl group, an ethyl group, an n-propyl group, an isopropyl group, an n-butyl group, a sec-butyl group, a tert-butyl group, an n-pentyl group, an isopentyl group, a neopentyl group, an n-hexyl group, an isohexyl group, an n-heptyl group, an n-octyl group, a cyclohexyl group, a 2-ethylhexyl group, an n-nonyl group, an isononyl group, a p-tert-butylcyclohexyl group, an n-decyl group, an n-dodecylnonyl group, an undecyl group, a dodecyl group, a tridecyl group, a tetradecyl group, a pentadecyl group, a hexadecyl group, a heptadecyl group, an octadecyl group, a nonadecyl group, an eicosyl group, and the like. The alkyl group is preferably an alkyl group having 1 to 12 carbon atoms, more preferably an alkyl group having 1 to 8 carbon atoms, and even more preferably an alkyl group having 1 to 4 carbon atoms.

Examples of the alkyl group having 1 to 20 carbon atoms, which is interrupted by an oxygen atom, a sulfur atom, or an amide bond, include alkyl groups containing a structural unit —$CH_2$—O—, —$CH_2$—S—, —$CH_2$—NHCO—, or —$CH_2$—CONH—. One unit or two or more units of —O—, —S—, —NHCO—, and/or —CONH— units may be contained in the alkyl group. Specific examples of the alkyl group having 1 to 20 carbon atoms, which is interrupted by —O—, —S—, —NHCO—, and/or —CONH— unit, include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, a butylaminocarbonyl group, and the like; as well as a methyl group, an ethyl group, a propyl group, a butyl group, a pentyl group, a hexyl group, a heptyl group, an octyl group, a nonyl group, a decyl group, a dodecyl group, and an octadecyl group that are each substituted by a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, an ethylaminocarbonyl group, or the like. A methoxy group, an ethoxy group, a methylthio group, and an ethylthio group are preferred; and a methoxy group and an ethoxy group are more preferred.

Because these solvents each have a relatively high boiling point, these solvents are also effective for imparting a high embedding property and high planarization property to the resist underlayer film-forming composition.

Specific examples of the preferable compounds represented by Formula (1) will be shown below.

[Formula 8]

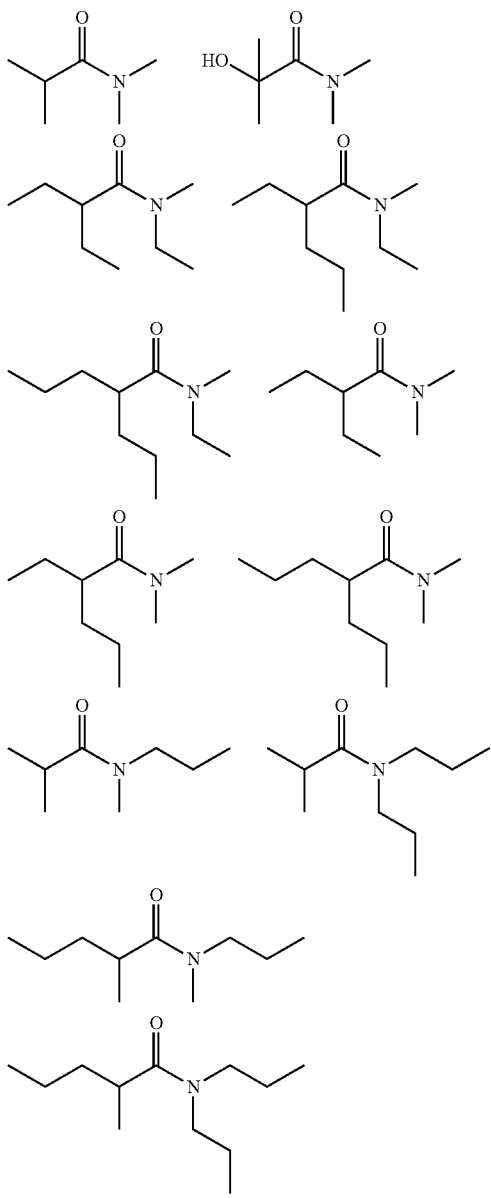

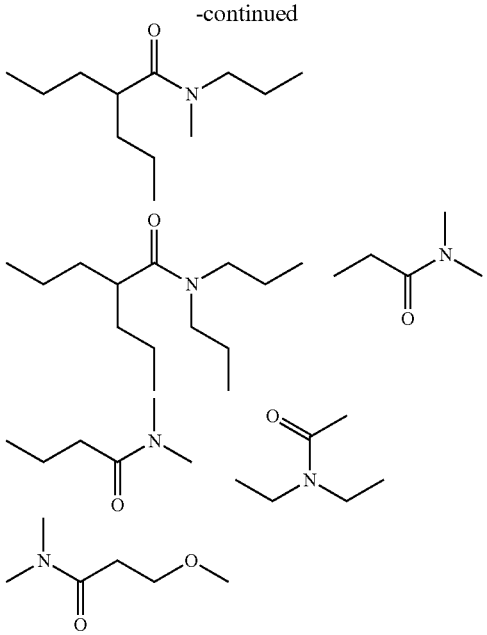

Of these, 3-methoxy-N,N-dimethylpropionamide, N,N-dimethylisobutylamide, and
compounds represented by the following formulas are preferable.

[Formula 9]

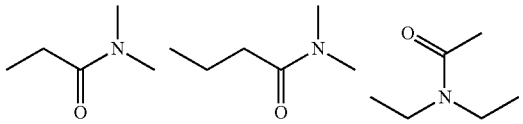

Particularly preferable compounds represented by Formula (1) are 3-methoxy-N,N-dimethylpropionamide and N,N-dimethylisobutylamide.

1.1.2. Other Solvents

As the solvent of the resist underlayer film-forming composition according to the present invention, a solvent other than the compound represented by Formula (1) above may be used in combination. As such a solvent, a solvent that is compatible with the compound represented by Formula (1) and that can dissolve the polymer described below may be used with no particular limitation. In particular, because the resist underlayer film-forming composition according to the present invention is used in a state of a uniform solution, in view of its coating performance, combined use with a solvent that is ordinarily used for lithography process is recommended.

Examples of such a solvent include methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethoxyethyl acetate, hydroxyethyl acetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, hydroxyethyl acetate, ethyl 2-hydroxy-2-methylpropionate, methyl 3-methoxy-2-methylpropionate, methyl 2-hydroxy-3-methylbutyrate, methoxyethyl acetate, ethoxyethyl acetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, γ-butyrolactone, and the like. These solvents may be used each alone or in combination of two or more.

Of these solvents, propylene glycol monomethyl ether, propylene glycol monomethyl ether acetate, ethyl lactate, butyl lactate, cyclohexanone, and the like are preferred. Propylene glycol monomethyl ether and propylene glycol monomethyl ether acetate are particularly preferred.

1.2. Polymer

The polymer contained in the resist underlayer film-forming composition according to the present invention is not particularly limited, and various organic polymers may be used. Polycondensation polymers, addition polymerization polymers, and the like may be used. Addition polymerization polymers and polycondensation polymers, such as polyester, polystyrene, polyimide, acrylic polymers, methacrylic polymers, polyvinyl ether, phenol novolac, naphthol novolac, polyether, polyamide, and polycarbonate, may be used. An organic polymer having an aromatic ring structure, such as a benzene ring, a naphthalene ring, an anthracene ring, a triazine ring, a quinoline ring, or a quinoxaline ring, that functions as a light absorption site may be preferably used.

Examples of such an organic polymer include addition polymerization polymers having an addition polymerizable monomer as a structural unit, such as benzyl acrylate, benzyl methacrylate, phenyl acrylate, naphthyl acrylate, anthryl methacrylate, anthryl methyl methacrylate, styrene, hydroxy styrene, benzyl vinyl ether, and N-phenylmaleimide, and polycondensation polymers, such as phenol novolac and naphthol novolac.

When an addition polymerization polymer is used as the organic polymer, the polymer compound may be a homopolymer or a copolymer. For the production of the addition polymerization polymer, an addition polymerizable monomer is used. Examples of such an addition polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, acrylonitrile, and the like.

Examples of the acrylic acid ester compound include methyl acrylate, ethyl acrylate, n-hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, glycidyl acrylate, and the like.

Examples of the methacrylic acid ester compound include methyl methacrylate, ethyl methacrylate, n-hexylmethacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, bromophenyl methacrylate, and the like.

Examples of the acrylamide compound include acrylamide, N-methylacrylamide, N-ethylacrylamide, N-benzylacrylamide, N-phenylacrylamide, N,N-dimethylacrylamide, N-anthrylacrylamide, and the like.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, N-anthrylacrylamide, and the like.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinyl naphthalene, vinyl anthracene, and the like.

Examples of the styrene compound include styrene, hydroxystyrene, chlorostyrene, bromostyrene, methoxystyrene, cyanostyrene, acetylstyrene, and the like.

Examples of the maleimide compound include maleimide, N-methylmaleimide, N-phenylmaleimide, N-cyclohexylmaleimide, N-benzylmaleimide, N-hydroxyethylmaleimide, and the like.

When a polycondensation polymer is used as the polymer, examples of such a polymer include a polycondensation polymer of a glycol compound and a dicarboxylic acid compound. Examples of the glycol compound include diethylene glycol, hexamethylene glycol, butylene glycol, and the like. Examples of the dicarboxylic acid compound include succinic acid, adipic acid, terephthalic acid, maleic anhydride, and the like. Examples thereof also include polyesters, polyamides, and polyimides of polypyromellitimide, poly (p-phenylene terephthalamide), polybutylene terephthalate, polyethylene terephthalate, and the like.

Furthermore, examples thereof also include aromatic polyether ketones, such as polyether ketone and polyether ether ketone.

When a hydroxyl group is contained in the organic polymer, the hydroxyl group can undergo a crosslinking reaction with polyorganosiloxane.

As the weight average molecular weight of the organic polymer, the lower limit thereof is preferably 1000, 3000, 5000, and 10000 in this order, and the upper limit thereof is preferably 1000000, 300000, 200000, and 100000 in this order.

The organic polymer may be used alone, or in combination of two or more.

The blended proportion of the organic polymer is from 1 to 200 parts by mass, from 5 to 100 parts by mass, from 10 to 50 parts by mass, or from 20 to 30 parts by mass, per 100 parts by mass, in terms of solid content, of the resist underlayer film-forming composition.

Some particularly preferable polymers for use in the present invention will be described below.

1.2.1. Novolac Resin

A novolac resin typically refers to a phenol resin in which the ratio of formaldehyde to phenol obtained as a result of condensation of reactants is less than 1:1. A novolac resin is suitable for use that requires high heat resistance and high etching resistance.

The novolac resin that may be used in the present invention is not particularly limited as long as the novolac resin is a novolac resin having conventionally been used for resist underlayer film-forming compositions, and examples of the particularly preferable novolac resin according to the present invention include novolac resins containing a structural unit represented by Formula (2).

[Formula 10]

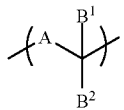

Formula (2)

In Formula (2), A represents a divalent group derived from an aromatic compound having 6 to 40 carbon atoms, in which a hydrogen atom of the aromatic compound having 6 to 40 carbon atoms may be replaced with an alkyl group having 1 to 20 carbon atoms, a condensed ring group, a heterocyclic group, a hydroxy group, an amino group, an ether group, an alkoxy group, a cyano group, a nitro group, or a carboxyl group, but is preferably unsubstituted; $B^1$ and $B^2$ are each selected from the group consisting of a hydrogen atom, an alkyl group having 1 to 20 carbon atoms, which may be interrupted by an oxygen atom or a sulfur atom, a heterocyclic group and an aryl group having 6 to 40 carbon atoms, of which a hydrogen atom may be substituted, and $B^1$ and $B^2$ may form a ring together with a carbon atom to which $B^1$ and $B^2$ are bonded.

The unit structure represented by Formula (2) above may be one type or two or more types but is preferably one type.

The condensed ring group is a substituent derived from a condensed ring compound, and specific examples thereof include a phenyl group, a naphthyl group, an anthracenyl group, a phenanthrenyl group, a naphthacenyl group, a triphenylenyl group, a pyrenyl group, and a chrysenyl group. Of these, a phenyl group, a naphthyl group, an anthracenyl group, and a pyrenyl group are preferred.

The heterocyclic group is a substituent derived from a heterocyclic compound, and specific examples thereof include a thiophene group, a furan group, a pyridine group, a pyrimidine group, a pyrazine group, a pyrrole group, an oxazole group, a thiazole group, an imidazole group, a quinoline group, a carbazole group, a quinazoline group, a purine group, an indolizine group, a benzothiophene group, a benzofuran group, an indole group, an acridine group, an isoindole group, a benzimidazole group, an isoquinoline group, a quinoxaline group, a cinnoline group, a pteridin group, a chromene group (benzopyran group), an isochromene group (benzopyran group), a xanthene group, a thiazole group, a pyrazole group, an imidazoline group, and an azine group. Of these, a thiophene group, a furan group, a pyridine group, a pyrimidine group, a pyrazine group, a pyrrole group, an oxazole group, a thiazole group, an imidazole group, a quinoline group, a carbazole group, a quinazoline group, a purine group, an indolizine group, a benzothiophene group, a benzofuran group, an indole group, and an acridine group are preferred. A thiophene group, a furan group, a pyridine group, a pyrimidine group, a pyrrole group, an oxazole group, a thiazole group, an imidazole group, and a carbazole group are most preferred.

The aromatic compound having 6 to 40 carbon atoms that derives divalent group A is a component constituting the novolac resin. The aromatic compound may be (a) a monocyclic compound such as benzene, (b) a condensed ring compound such as naphthalene, (c) a heterocyclic compound such as furan, thiophene, or pyridine, (d) a compound in which aromatic rings out of (a) to (c) are linked by a single bond, such as biphenyl, or (e) a compound in which aromatic rings out of (a) to (d) are linked by a spacer, such as —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, and —CH=N—.

Examples of the aromatic compound include benzene, thiophene, furan, pyridine, pyrimidine, pyrazine, pyrrole, oxazole, thiazole, imidazole, naphthalene, anthracene, quinoline, carbazole, quinazoline, purine, indolizine, benzothiophene, benzofuran, indole, acridine, and the like.

An aromatic amine or a phenolic hydroxy group-containing compound is preferred.

Examples of the aromatic amine include phenylindole, phenylnaphthylamine, and the like.

Examples of the phenolic hydroxy group-containing compound include phenol, dihydroxy benzene, trihydroxy benzene, hydroxy naphthalene, dihydroxy naphthalene, trihydroxy naphthalene, tris(4-hydroxyphenyl)methane, tris(4-hydroxyphenyl)ethane, 1,1,2,2-tetrakis(4-hydroxyphenyl)ethane, and the like.

The hydrogen atom of the aromatic compound having 6 to 40 carbon atoms may be substituted by an alkyl group having 1 to 20 carbon atoms, a condensed ring group, a heterocyclic group, a hydroxy group, an amino group, a nitro group, an ether group, an alkoxy group, a cyano group, or a carboxyl group.

A is preferably a divalent group derived from an arylamine compound having 6 to 40 carbon atoms.

Note that the aromatic compounds described above may be linked by a single bond or a spacer.

Examples of the spacer include one type or a combination of two or more types of —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, and —CH=N—. Two or more of these spacers may be linked.

Alternatively, A may be a divalent group derived from an aromatic compound having an amino group, a hydroxyl group, or an amino group and a hydroxyl group. Furthermore, A may be a divalent group derived from an aromatic compound having an arylamine compound, a phenol compound, or an arylamine compound and a phenol compound. More specifically, A may be a divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or a polynuclear phenol.

Examples of the polynuclear phenol include dihydroxy benzene, trihydroxy benzene, hydroxy naphthalene, dihydroxy naphthalene, trihydroxy naphthalene, tris(4-hydroxyphenyl)methane, tris(4-hydroxyphenyl)ethane, 2,2'-biphenol, 1,1,2,2-tetrakis(4-hydroxyphenyl)ethane, and the like.

Examples of the alkyl groups having 1 to 20 carbon atoms in the definitions of A, $B^1$, and $B^2$ include straight or branched alkyl groups that may have a substituent or no substituent. Examples thereof include a methyl group, an ethyl group, an n-propyl group, an isopropyl group, an n-butyl group, a sec-butyl group, a tert-butyl group, an n-pentyl group, an isopentyl group, a neopentyl group, an n-hexyl group, an isohexyl group, an n-heptyl group, an n-octyl group, a cyclohexyl group, a 2-ethylhexyl group, an n-nonyl group, an isononyl group, a p-tert-butylcyclohexyl group, an n-decyl group, an n-dodecylnonyl group, an undecyl group, a dodecyl group, a tridecyl group, a tetradecyl group, a pentadecyl group, a hexadecyl group, a heptadecyl group, an octadecyl group, a nonadecyl group, an eicosyl group, and the like. The alkyl group is preferably an alkyl group having 1 to 12 carbon atoms, more preferably an alkyl group having 1 to 8 carbon atoms, and still more preferably an alkyl group having 1 to 4 carbon atoms.

Examples of the alkyl group having 1 to 20 carbon atoms, which is interrupted by an oxygen atom, a sulfur atom, or an amide bond, include an alkyl group containing a structural unit —CH$_2$—O—, —CH$_2$—S—, —CH$_2$—NHCO—, or —CH$_2$—CONH—. The alkyl group may contain one or two or more units of —O—, —S—, —NHCO—, and/or —CONH—. Specific examples of the alkyl group having 1 to 20 carbon atoms, which is interrupted by —O—, —S—, —NHCO—, and/or —CONH— unit, include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, a butylaminocarbonyl group, and the like; as well as a methyl group, an ethyl group, a propyl group, a butyl group, a pentyl group, a hexyl group, a heptyl group, an octyl group, a nonyl group, a decyl group, a dodecyl group, and an octadecyl group, each of which is substituted by a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, an ethylaminocarbonyl group, or the like. A methoxy group, an ethoxy group, a methylthio group, and an ethylthio group are preferred; and a methoxy group and an ethoxy group are more preferred.

The heterocyclic group and the aryl group having 6 to 40 carbon atoms in the definitions of $B^1$ and $B^2$ may be (a) a group derived from a monocycle such as benzene, (b) a group derived from a condensed ring such as naphthalene, (c) a group derived from a heterocycle such as furan, thiophene, or pyridine, (d) a group in which aromatic rings out of (a) to (c) are linked by a single bond, such as biphenyl, or (e) a compound in which aromatic rings out of (a) to (d) are linked by a spacer, such as —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, and —CH=N—.

Preferred aromatic rings are a benzene ring, a thiophene ring, a furan ring, a pyridine ring, a pyrimidine ring, a pyrazine ring, a pyrrole ring, an oxazole ring, a thiazole ring, an imidazole ring, a naphthalene ring, an anthracene ring, a quinoline ring, a carbazole ring, a quinazoline ring, a purine ring, an indolizine ring, a benzothiophene ring, a benzofuran ring, an indole ring, and acridine ring.

More preferred aromatic rings are a benzene ring, a thiophene ring, a furan ring, a pyridine ring, a pyrimidine ring, a pyrrole ring, an oxazole ring, a thiazole ring, an imidazole ring, and a carbazole ring.

The aromatic rings described above may be linked by a single bond or a spacer.

Examples of the spacer include one type or a combination of two or more types of —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, and —CN=N—. Two or more of these spacers may be linked.

Any A, $B^1$, and $B^2$ may be selected within the range described above; however, A, $B^1$, and $B^2$ are preferably selected so that the novolac resin is sufficiently dissolved in the solvent used in the present invention described above and so that a resist underlayer film-forming composition that passes through a microfilter having a pore diameter of 0.1 μm is provided.

The novolac resin can be obtained by allowing the aromatic compound described above to react with an aldehyde or ketone.

Examples of the acid catalyst used in the reaction include mineral acids, such as sulfuric acid, phosphoric acid, and perchloric acid; organic sulfonic acids, such as p-toluenesulfonic acid, p-toluenesulfonic acid monohydrate, and methanesulfonic acid; and carboxylic acids, such as formic acid and oxalic acid. The used amount of the acid catalyst is selected depending on the type of the acid to be used. Typically, the used amount is from 0.001 to 10000 parts by mass, preferably from 0.01 to 1000 parts by mass, and more preferably from 0.1 to 100 parts by mass, per 100 parts by mass of the aromatic compound.

Although the condensation reaction and the addition reaction described above may also be performed without a solvent, typically a solvent is used. As the solvent, any solvent that does not inhibit the reaction may be used. Examples thereof include ethers, such as 1,2-dimethoxyethane, diethylene glycol dimethyl ether, propylene glycol monomethyl ether, tetrahydrofuran, and dioxane.

The reaction temperature typically ranges from 40° C. to 200° C. The reaction time is selected depending on the reaction temperature but ranges typically approximately from 30 minutes to 50 hours.

The weight average molecular weight Mw of the polymer obtained as described above ranges typically from 500 to 1000000, or from 600 to 200000.

Examples of the novolac resins that are suitably used in the present invention are as follows.

[Formula 11]

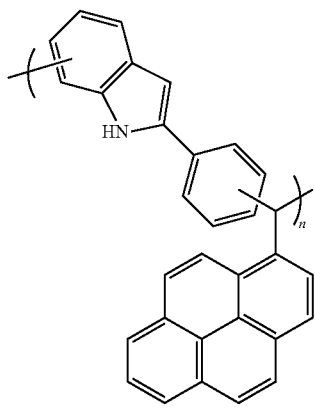

[Formula 12]

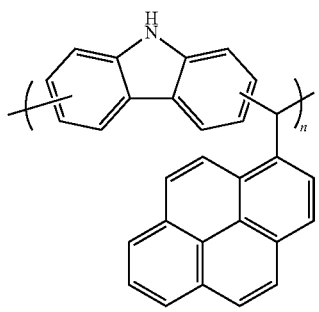

[Formula 13]

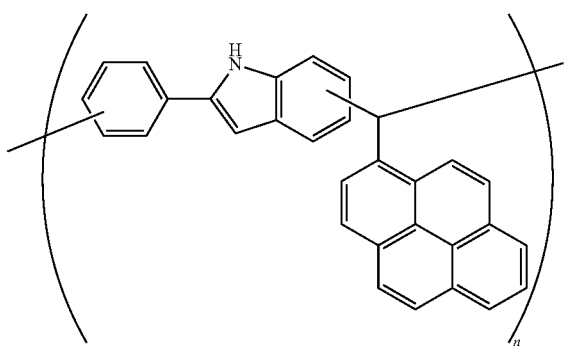

[Formula 14]

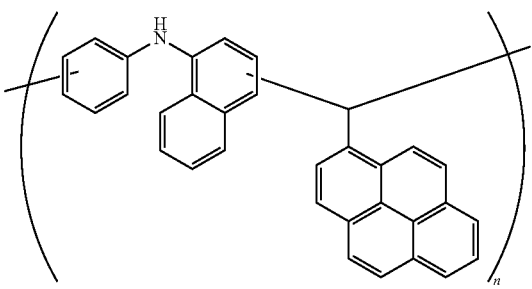

[Formula 15]

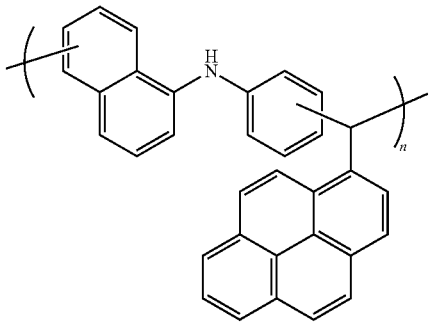

[Formula 16]

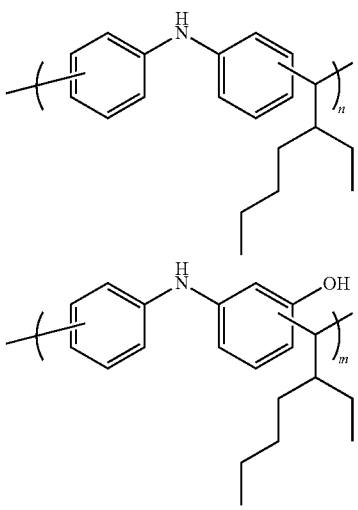

1.2.2. Polyether Ether Ketone (PEEK)

The polyether ether ketone resin typically refers to a polymer in which a straight chain structure is mainly bonded in the order of an ether bond, an ether bond, and a ketone bond. A polyether ether ketone resin is suitable for use that requires high heat resistance.

The polyether ether ketone resin that may be used in the present invention is not particularly limited as long as the polyether ether ketone resin is a polyether ether ketone resin having been used for resist underlayer film-forming compositions, and examples of the particularly preferable polyether ether ketone resin according to the present invention include polyether ether ketone resins containing a partial structure represented by Formula (3).

[Formula 17]

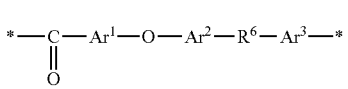

Formula (3)

In Formula (3), $Ar^1$, $Ar^2$, and $Ar^3$ each represent an organic group containing a heterocyclic group or an arylene group having 6 to 50 carbon atoms; $R^6$ represents an unsubstituted or substituted alkylene group having 1 to 12 carbon atoms; and * is a site of bonding to another organic group.

In the partial structure represented by Formula (3), $Ar^1$, $Ar^2$, and $Ar^3$ each represent an organic group containing a heterocyclic group and an arylene group having 6 to 50 carbon atoms. The organic group is divalent to tetravalent, for example. One type or combination of two or more types of the heterocyclic group or the arylene group in the organic group represented by $Ar^1$, $Ar^2$, and $Ar^3$ may be used. The heterocyclic group and the arylene group are each divalent to tetravalent, for example.

The arylene group having 6 to 50 carbon atoms is a divalent organic group corresponding to the aryl group, and examples thereof include a divalent groups, corresponding to a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a fluorene group, a fluorene derivative group, a pyrene group, and a pentacene group.

Examples of the heterocyclic group include organic groups corresponding to heterocyclic rings, such as pyrrole, thiophene, furan, imidazole, triazole, oxazole, thiazole, pyrazole, isoxazole, isothiazole, pyridine, pyridazine, pyrimidine, pyrazine, piperidine, piperazine, morpholine, pyran, and carbazole.

$R^6$ represents an unsubstituted or substituted alkylene group having 1 to 12 carbon atoms.

More preferably, $R^6$ is represented by Formula (4).

[Formula 18]

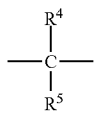

Formula (4)

In Formula (4), $R^4$ and $R^5$ each independently represent
a hydrogen atom,
an alkyl group having 1 to 10 carbon atoms, which may be substituted by at least one substituent selected from the group consisting of a hydroxy group, an amino group, and halogen atoms; and preferably, an unsubstituted alkyl group having 1 to 10 carbon atoms,
an aryl group having 6 to 40 carbon atoms, which may be substituted by a hydroxy group; and preferably, an unsubstituted aryl group having 6 to 40 carbon atoms, or
an aryl group having 6 to 20 carbon atoms, which may bond to another organic group through —O—.

$R^4$ and $R^5$ may bond to each other to form a cyclic structure, and $R^4$ or $R^5$ may bond to any one of $Ar^1$, $Ar^2$, or $Ar^3$ to form a cyclic structure.

Examples of the alkyl group having 1 to 10 carbon atoms include straight or branched alkyl groups that may be each substituted by at least one substituent selected from the group consisting of a hydroxy group, an amino group, and/or halogen atom. Examples thereof include a methyl group, an ethyl group, an n-propyl group, an isopropyl group, an n-butyl group, a sec-butyl group, a tert-butyl group, an n-pentyl group, an isopentyl group, a neopentyl group, an n-hexyl group, an isohexyl group, an n-heptyl group, an n-octyl group, a cyclohexyl group, a 2-ethylhexyl group, an n-nonyl group, an isononyl group, a p-tert-butylcyclohexyl group, an n-decyl group, and the like. The alkyl group is preferably an alkyl group having 1 to 8 carbon atoms, more preferably an alkyl group having 1 to 6 carbon atoms, and even more preferably an alkyl group having 1 to 4 carbon atoms.

The aryl group having 6 to 40 carbon atoms may be (a) a group derived from a monocycle such as benzene, (b) a group derived from a condensed ring such as naphthalene, (c) a group derived from a heterocycle such as furan, thiophene, or pyridine, (d) a group in which aromatic rings out of (a) to (c) are linked by a single bond, such as biphenyl, or (e) a compound in which aromatic rings out of (a) to (d) are linked by a spacer, such as —CH—, —(CH$_2$)$_n$— (n=1 to 20), —CH═CH—, —CH≡CH—, —N═N—, —NH—, —NHR—, —NCHO—, —NRCO—, —S—, —COO—, —O—, —CO—, and —CH═N—.

Preferred aromatic rings are a benzene ring, a naphthalene ring, and an anthracene ring. The aromatic rings described above may be linked by a single bond or a spacer.

Examples of the spacer include one type or a combination of two or more types of —CH—, —(CH$_2$)$_n$— (n=1 to 20), —CH═CH—, —CH≡CH—, —N═N—, —NH—, —NHR—, —NHCO—, —NRCO—, —S—, —COO—, —O—, —CO— and —CH═N—. Two or more of these spacers may be linked.

Any $Ar^1$, $Ar^2$, $Ar^3$, and $R^6$ may be selected within the range described above; however, $Ar^1$, $Ar^2$, $Ar^3$, and $R^6$ are preferably selected so that the polyether ether ketone resin is sufficiently dissolved in the solvent used in the present invention described above and so that a resist underlayer film-forming composition that passes through a microfilter having a pore diameter of 0.1 μm is provided.

"Another organic group" in the definitions of $R^4$ and $R^5$ of Formula (4) above refers to both "another organic group" contained in the partial structure of the same molecule and "another organic group" contained in the partial structure of another molecule. Therefore, "another organic group" also encompasses a partial structure containing a bond to an organic group in a partial structure of different molecules, which has been formed by dehydration reaction or the like, using as a precursor a polymer containing in the partial structure an aryl group having 6 to 20 carbon atoms, which may be substituted by a hydroxy group.

The polyether ether ketone resin used in the present invention has a weight average molecular weight of preferably from 600 to 1000000, and more preferably from 1000 to 200000.

Examples of the polyether ether ketone resins that are suitably used in the present invention are as follows.

[Formula 19]

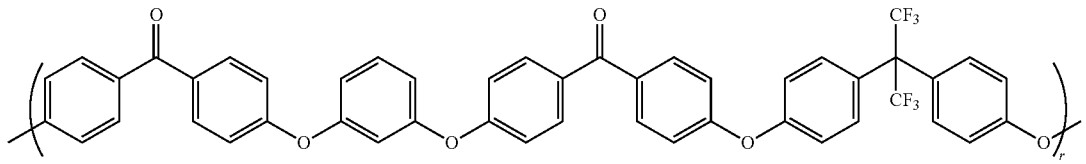

1.2.3. Maleimide Resin

The maleimide resin typically refers to a compound having a plurality of maleimide group in the molecule. Examples include addition polymerization polymers produced by addition polymerizable compounds of maleimide compounds. Examples of such maleimide compounds include maleimide, N-methylmaleimide, N-phenylmaleimide, N-cyclohexylmaleimide, N-benzylmaleimide, N-hydroxyethylmaleimide, and the like. A maleimide resin is suitable for use that requires high heat resistance.

The maleimide resin that may be used in the present invention is not particularly limited as long as the maleimide resin is a maleimide resin having conventionally been used for resist underlayer film-forming compositions but is preferably a polymer derived from a bismaleimide compound. The bismaleimide compound can enhance planarization property.

More preferably, the polymer derived from a bismaleimide compound contains a structural unit represented by Formula (5) below.

[Formula 20]

Formula (5)

In Formula (5), $R^7$ represents a divalent organic group. $R^7$ may contain a bond, such as —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, and —CH=N—.

Examples of such a bismaleimide compound include, but not limited to, N,N'-3,3-diphenylmethane bismaleimide, N,N'-(3,3-diethyl-5,5-dimethyl)-4,4-diphenyl-methane bismaleimide, N,N'-4,4-diphenylmethane bismaleimide, 3,3-diphenylsulfone bismaleimide, 4,4-diphenylsulfone bismaleimide, N,N'-p-benzophenone bismaleimide, N,N'-diphenylethane bismaleimide, N,N'-diphenylether bismaleimide, N,N'-(methylene-ditetrahydrophenyl)bismaleimide, N,N'-(3-ethyl)-4,4-diphenylmethane bismaleimide, N,N'-(3,3-dimethyl)-4,4-diphenylmethane bismaleimide, N,N'-(3,3-diethyl)-4,4-diphenylmethane bismaleimide, N,N'-(3,3-dichloro)-4,4-diphenylmethane bismaleimide, N,N'-isophorone bismaleimide, N,N'-tolidine bismaleimide, N,N'-diphenylpropane bismaleimide, N,N'-naphthalene bismaleimide, N,N'-m-phenylene bismaleimide, N,N'-5-methoxy-1,3-phenylene bismaleimide, 2,2-bis(4-(4-maleimidephenoxy)phenyl)propane, 2,2-bis(3-chloro-4-(4-maleimidephenoxy)phenyl)propane, 2,2-bis(3-bromo-4-(4-maleimidephenoxy)phenyl)propane, 2,2-bis(3-ethyl-4-(4-maleimidephenoxy)phenyl)propane, 2,2-bis(3-propyl-4-(4-maleimidephenoxy)phenyl)propane, 2,2-bis(3-isopropyl-4-(4-maleimidephenoxy)phenyl)propane, 2,2-bis(3-butyl-4-(4-maleimidephenoxy)phenyl)propane, 2,2-bis(3-methoxy-4-(4-maleimidephenoxy)phenyl)propane, 1,1-bis(4-(4-maleimidephenoxy)phenyl)ethane, 1,1-bis(3-methyl-4-(4-maleimidephenoxy)phenyl)ethane, 1,1-bis(3-chloro-4-(4-maleimidephenoxy)phenyl)ethane, 1,1-bis(3-bromo-4-(4-maleimidephenoxy)phenyl)ethane, 3,3-bis(4-(4-maleimidephenoxy)phenyl)pentane, 1,1,1,3,3,3-hexafluoro-2,2-bis(4-(4-maleimidephenoxy)phenyl)propane, 1,1,1,3,3,3-hexafluoro-2,2-bis(3,5-dimethyl-4-(4-maleimidephenoxy)phenyl)propane, 1,1,1,3,3,3-hexafluoro-2,2-bis(3,5-dibromo-4-(4-maleimidephenoxy)phenyl) propane, N,N'-ethylene dimaleimide, N,N'-hexamethylene bismaleimide, N,N'-dodecamethylene bismaleimide, N,N'-m-xylene bismaleimide, N,N'-p-xylene bismaleimide, N,N'-1,3-bismethylenecyclohexane bismaleimide, N,N'-2,4-tolylene bismaleimide, N,N'-2,6-tolylene bismaleimide, and the like. These bismaleimide compounds may be used alone or in combination of two or more.

Of these bismaleimide compounds, aromatic bismaleimides, such as 2,2-bis(4-(4-maleimidephenoxy)phenyl)propane, N,N'-4,4-diphenylmethane bismaleimide, and N,N'-(3,3-diethyl-5,5-dimethyl)-4,4-diphenyl-methane bismaleimide, are preferred.

Furthermore, of these aromatic bismaleimide compounds, those having a molecular weight of 2000 or less is preferred to achieve even higher planarization property.

Any maleimide compound, bismaleimide compound, and $R^7$ in Formula (5) above may be selected within the range described above; however, the maleimide compound, the bismaleimide compound, and $R^7$ are preferably selected so that the maleimide resin is sufficiently dissolved in the solvent used in the present invention described above and so that a resist underlayer film-forming composition that passes through a microfilter having a pore diameter of 0.1 μm is provided.

Examples of the resins that are suitably used in the present invention are as follows.

[Formula 21]

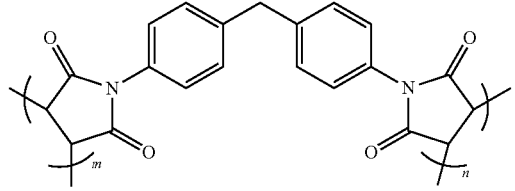

1.2.4.1. The polymer according to the present invention may be a polymer obtained by polymerizing a monomer represented by Chemical Formula 1 below by a known method.

[Formula 22]

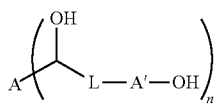

[Chemical Formula 1]

In Chemical Formula 1 above,

A and A' are the same or different and are each a substituted or unsubstituted aromatic group;

L is a single bond or a substituted or unsubstituted C1 to C6 alkylene group; and n is an integer of 1 to 5.

The monomer may be a monomer represented by Chemical Formula 1a, 1b, or 1c below.

[Formula 23]

[Chemical Formula 1a]

$A^1 \underset{L^1}{\overset{OH}{\diagup}} A^2 \diagdown OH$

[Chemical Formula 1b]

$HO \diagdown A^3 \diagup L^2 \diagdown A^1 \underset{L^1}{\overset{OH}{\diagup}} \overset{OH}{A^2} \diagdown OH$

[Chemical Formula 1c]

$HO \diagdown A^3 \diagup L^2 \diagdown A^1 \underset{L^1}{\overset{OH}{\diagup}} \overset{OH}{A^2} \diagdown OH$ with $HO \diagdown L^3 \diagdown A^4 \diagdown OH$ In Chemical Formulas 1a, 1b, and 1c above, $A^1$ to $A^4$ may be each a substituted or unsubstituted benzene group, naphthalene group, pyrene group, perylene group, benzoperylene group, or coronene group, or a combination of these; and $L^1$ to $L^3$ are each independently a single bond or a substituted or unsubstituted C1-C6 alkylene group.

1.2.4.2. The polymer may be a polymer containing a unit structure represented by Chemical Formula 1 below.

[Formula 24]

[Chemical Formula 1]

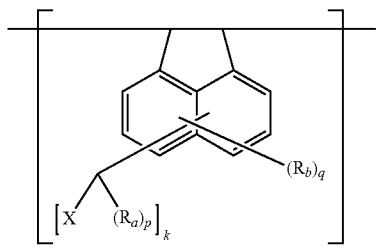

In Chemical Formula 1 above, p is an integer of 1 or 2, q is an integer of 1 to 5, k is an integer of 1 to 6, and q+k is an integer of 1 to 6;

X is a hydroxy group (—OH), a substituted or unsubstituted C1-C10 alkoxy group, or a substituted or unsubstituted C6-C30 aryloxy group;

$R_a$ is a substituted or unsubstituted C1-C10 alkyl group, a substituted or unsubstituted C3-C8 cycloalkyl group, a substituted or unsubstituted C6-C30 aryl group, a substituted or unsubstituted C2-C10 alkenyl group, or halogen; and $R_b$ is hydrogen, a substituted or unsubstituted C1-C10 alkyl group, a substituted or unsubstituted C3-C8 cycloalkyl group, or a substituted or unsubstituted C6-C30 aryl group.

1.2.4.3. The polymer may be a polymer having at least one of the repeating unit represented by Chemical Formula 1 below and the repeating unit represented by Chemical Formula 2 below.

[Formula 25]

[Chemical Formula 1]

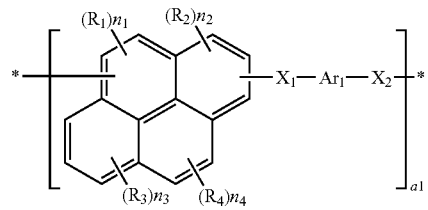

[Formula 26]

[Chemical Formula 2]

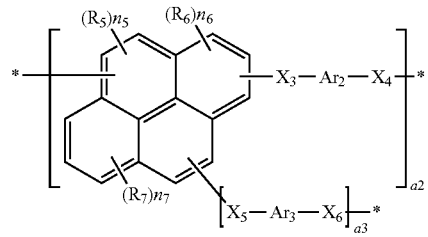

In Chemical Formulas 1 and 2, $R_1$, $R_3$, $R_4$, $R_5$, and $R_7$ are each independently a hydrogen atom, a hydroxy group, a halogen atom, a substituted or unsubstituted, straight or branched alkyl group having 1 to 10 carbons, a substituted or unsubstituted aryl group having 6 to 20 carbons, a substituted or unsubstituted, allyl group-containing functional group having 3 to 10 carbons, a substituted or unsubstituted heteroaryl group having 3 to 20 carbons, a substituted or unsubstituted, straight or branched alkoxy group having 1 to 20 carbons, a substituted or unsubstituted, carbonyl group-containing functional group having 1 to 20 carbons, a substituted or unsubstituted amino group, a substituted or unsubstituted siloxy group, or a substituted or unsubstituted silane group;

$R_2$ and $R_6$ are each independently a hydrogen atom, a halogen atom, a substituted or unsubstituted, straight or branched alkyl group having 1 to 10 carbons, a substituted or unsubstituted aryl group having 6 to 20 carbons, a substituted or unsubstituted, allyl group-containing functional group having 3 to 10 carbons, a substituted or unsubstituted heteroaryl group having 3 to 20 carbons, a substituted or unsubstituted, straight or branched alkoxy group having 1 to 20 carbons, a substituted or unsubstituted, carbonyl group-containing functional group having 1 to 20 carbons, a substituted or unsubstituted amino group, a substituted or unsubstituted siloxy group, or a substituted or unsubstituted silane group;

$n_1$ to $n_7$ are each independently an integer of 0 to 2; a1 to a3 are each independently an integer of 2 or greater and less than 100; and $Ar_1$ and $Ar_3$ are each independently an arylene group derived from any one selected from the group consisting of aromatic compounds represented by Chemical Formulas 3 to 13 below:

[Formula 27]

[Chemical Formula 3]

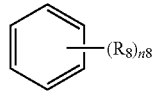

[Formula 28]

[Chemical Formula 4]

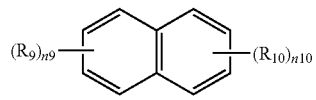

[Formula 29]

[Chemical Formula 5]

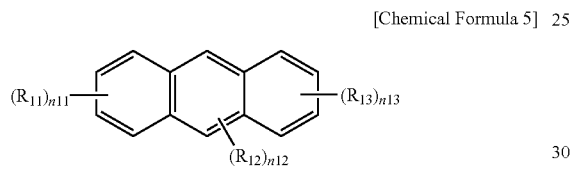

[Formula 30]

[Chemical Formula 6]

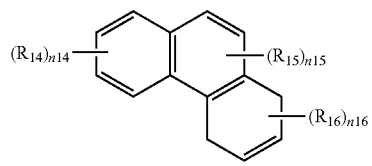

[Formula 31]

[Chemical Formula 7]

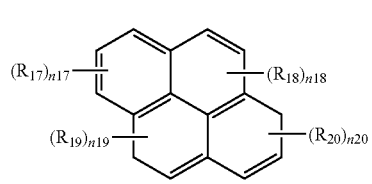

[Formula 32]

[Chemical Formula 8]

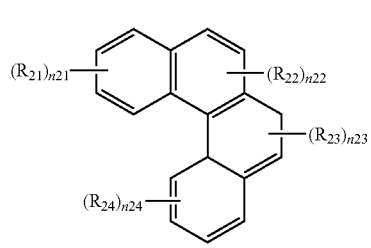

[Formula 33]

[Chemical Formula 9]

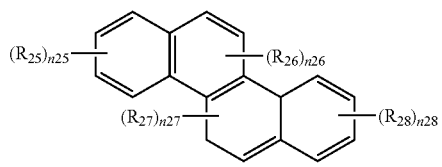

[Formula 34]

[Chemical Formula 10]

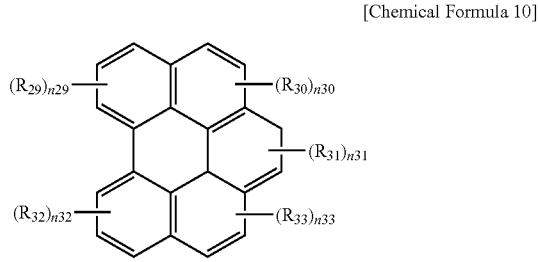

[Formula 35]

[Chemical Formula 11]

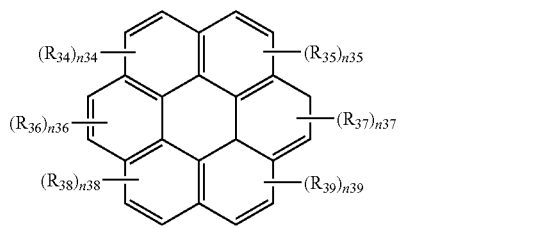

[Formula 36]

[Chemical Formula 12]

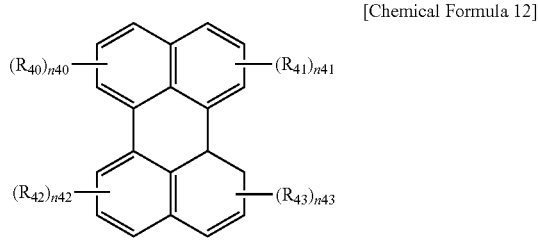

[Formula 37]

[Chemical Formula 13]

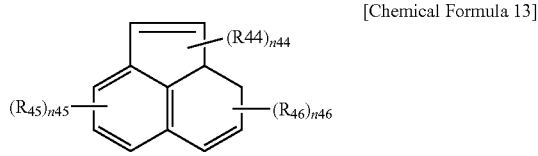

In Chemical Formulas 3 to 13, $R_8$ to $R_{33}$ and $R_{44}$ to $R_{46}$ are each independently a hydrogen atom, a hydroxy group, a substituted or unsubstituted, straight or branched alkyl group having 1 to 10 carbons, a substituted or unsubstituted aryl group having 6 to 20 carbons, a substituted or unsubstituted, straight, branched or cyclic alkenyl group having 2 to 10 carbons, or a halogen atom;

$R_{34}$ to $R_{39}$ are each independently a hydrogen atom, a substituted or unsubstituted, straight or branched alkyl group having 1 to 10 carbons, a substituted or unsubstituted aryl group having 6 to 20 carbons, a substituted or unsubstituted, straight, branched or cyclic alkenyl group having 2 to 10 carbons, or a halogen atom;

$n_8$ to $n_{46}$ are each independently an integer of 0 to 4;

$X_1$ to $X_6$ are each independently an organic group selected from the group consisting of organic groups represented by Chemical Formulas 14 to 20 below.

[Formula 38]

[Chemical Formula 14]

*—CH$_2$—*

[Formula 39]

[Chemical Formula 15]

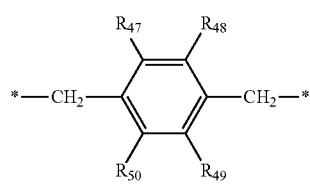

[Formula 40]

[Chemical Formula 16]

*—CH$_2$—⟨R$_{51}$ R$_{52}$ R$_{55}$ R$_{56}$ / R$_{53}$ R$_{54}$ R$_{57}$ R$_{58}$⟩—CH$_2$—*

[Formula 41]

[Chemical Formula 17]

*—CH—*
R$_{59}$, R$_{60}$, R$_{61}$, R$_{62}$, R$_{63}$

[Formula 42]

[Chemical Formula 18]

*—CH$_2$—[anthracene with R$_{64}$–R$_{73}$]—CH$_2$—*

[Formula 43]

[Chemical Formula 19]

*—CH$_2$—[naphthalene with R$_{74}$–R$_{81}$]—CH$_2$—*

[Formula 44]

[Chemical Formula 20]

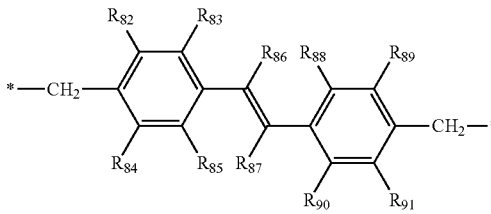

In Chemical Formulas 14 to 20, $R_{47}$ to $R_{91}$ are each independently a hydrogen atom, a substituted or unsubstituted, straight or branched alkyl group having 1 to 10 carbons, a substituted or unsubstituted aryl group having 6 to 20 carbons, a substituted or unsubstituted, allyl group-containing functional group having 3 to 10 carbons, or a halogen atom; and * represents a bonding site.

1.2.4.4. The polymer according to the present invention may be a polymerization reaction product containing a polymer obtained by polymerizing one or more than one tetraarylmethane monomer unit of Formula (1) below:

[Formula 45]

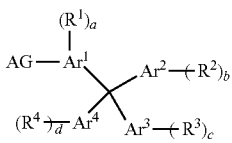

(1)

In the formula, AG represents an activating group selected from OR, NR$_2$, and SR; Ar$^1$, Ar$^2$, Ar$^3$, and Ar$^4$ are each independently represent an aryl moiety; R is each independently selected from H, optionally substituted C$_{1\text{-}30}$ alkyl, an optionally substituted C$_{2\text{-}30}$ alkenyl moiety, an optionally substituted C$_{2\text{-}30}$ alkynyl moiety, an optionally substituted C$_{7\text{-}30}$ aralkyl moiety, or an optionally substituted C$_{6\text{-}20}$ aryl moiety; R$^1$, R$^2$, R$^3$, and R$^4$ are each independently selected from optionally substituted C$_{1\text{-}30}$ alkyl, an optionally substituted C$_{2\text{-}30}$ alkenyl moiety, an optionally substituted C$_{2\text{-}30}$ alkynyl moiety, an optionally substituted C$_{7\text{-}30}$ aralkyl moiety, or an optionally substituted C$_{6\text{-}20}$ aryl moiety; any two of Ar$^1$, Ar$^2$, Ar$^3$, and Ar$^4$ may form a five-membered or six-membered condensed alicyclic ring together with the carbon to which they are bonded; a is an integer of 0 to 4; and b, c, and d are each independently an integer of 0 to 5.

1.2.4.5. The polymer according to the present invention may be a reaction product formed from a combination of at least one first monomer of the formula below:

[Formula 46]

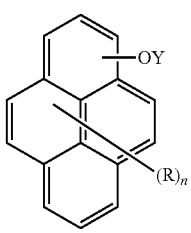

in the formula, Y is selected from H, $C_1$-$C_{30}$ alkyl, $C_2$-$C_{30}$ alkenyl, $C_7$-$C_{30}$ aralkyl, $C_6$-$C_{30}$ aryl, substituted $C_6$-$C_{30}$ aryl, —$C_1$-$C_{30}$ alkylene-$OR^1$, and —$C_1$-$C_{30}$ alkylidene-$OR^1$; R is each independently selected from $C_1$-$C_{30}$ alkyl, $C_2$-$C_{30}$ alkenyl, $C_7$-$C_{30}$ aralkyl, $C_6$-$C_{30}$ aryl, substituted $C_6$-$C_{30}$ aryl, —$OR^1$, —$C_1$-$C_{30}$ alkylene-$OR^1$, and —$C_1$-$C_{30}$ alkylidene-$OR^1$; $R^1$ is selected from H, $C_1$-$C_{30}$ alkyl, $C_6$-$C_{30}$ aryl, substituted $C_6$-$C_{30}$ aryl, and $C_7$-$C_{30}$ aralkyl; and n is an integer selected from 0 to 7; and at least one second monomer of the formula:

Ar—CHO in the formula, Ar is a $C_{10}$-$C_{30}$ aromatic moiety having at least two condensed aromatic rings, the aromatic moiety may be optionally substituted by at least one of $C_1$-$C_{30}$ alkyl, $C_2$-$C_{30}$ alkenyl, $C_7$-$C_{30}$ aralkyl, $C_6$-$C_{30}$ aryl, substituted $C_6$-$C_{30}$ aryl, —$OR^3$, —$C_1$-$C_{30}$ alkylene-$OR^3$, and —$C_1$-$C_{30}$ alkylidene-$OR^3$; and $R^3$ is selected from H, $C_1$-$C_{30}$ alkyl, and $C_6$-$C_{30}$ aryl.

1.2.4.6. The polymer according to the present invention may be replaced by a compound containing a group having a carbon-carbon triple bond, and a partial structure having an aromatic ring, the partial structure having at least 4 benzene nuclei constituting the aromatic ring. The partial structure may be as follows.

[Formula 47]

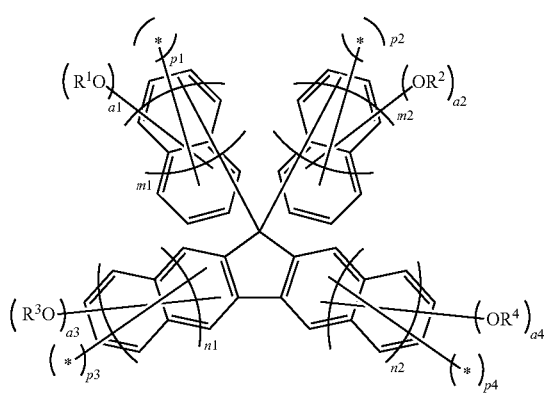

(1)

In Formula (1), $R^1$ to $R^4$ are each independently a hydrogen atom, a monovalent group having a carbon-carbon triple bond, or a monovalent group having a carbon-carbon double bond. m1 and m2 are each independently an integer of 0 to 2. a1 and a2 are each independently an integer of 0 to 9. n1 and n2 are each independently an integer of 0 to 2. a3 and a4 are each independently an integer of 0 to 8. When pluralities of $R^1$ to $R^4$ exist, the plurality of $R^1$ may be the same or different, the plurality of $R^2$ may be the same or different, the plurality of $R^3$ may be the same or different, and the plurality of $R^4$ may be the same or different. p1 and p2 are each independently an integer of 0 to 9. p3 and p4 are each independently an integer of 0 to 8. p1+p2+p3+p4 is 0 or greater. a1+p1 and a2+p2 are each 9 or less. a3+p3 and a4+p4 are each 8 or less. * indicates a site of bonding to a moiety other than the partial structure represented by Formula (1) of the compound.

1.2.4.7. The polymer according to the present invention may be replaced by a compound containing a partial structure represented by Formula (1) below and having an intermolecular bond-forming group.

[Formula 48]

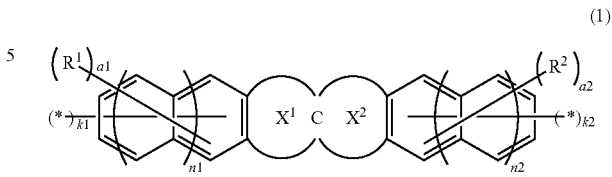

(1)

In Formula (1), $X^1$ and $X^2$ each independently represent a substituted or unsubstituted four-membered to ten-membered ring structure, which is formed by a Spiro carbon atom and carbon atoms of the aromatic rings. $R^1$ and $R^2$ are each independently a halogen atom, a hydroxy group, a nitro group, or a monovalent organic group. a1 and a2 are each independently an integer of 0 to 8. When pluralities of $R^1$ and $R^2$ exist, the plurality of $R^1$ may be the same or different, and the plurality of $R^2$ may be the same or different. n1 and n2 are each independently an integer of 0 to 2. k1 and k2 are each independently an integer of 0 to 8, provided that k1+k2 is 1 or greater. a1+k1 and a2+k2 are each 8 or less. * indicates a site of bonding to a moiety other than the partial structure described above.

1.2.4.8. The polymer according to the present invention may be replaced by a compound represented by Formula (1) below:

[Formula 49]

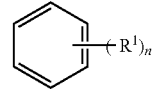

(1)

In Formula (1), $R^1$ represents a monovalent group containing an aromatic ring. n is an integer of 3 to 6, provided that at least one of the $R^1$ moieties further contains an ethylenic double bond-containing group. A plurality of the $R^1$ moieties may be the same or different. A part or all of the hydrogen atoms of the aromatic ring and of the benzene ring of Formula (1) above may be each replaced by a halogen atom or an alkyl group having 1 to 10 carbons.

1.2.4.9. The polymer according to the present invention may be replaced by a compound represented by Formula (1) below:

[Formula 50]

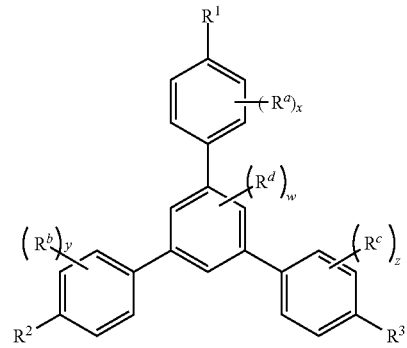

(1)

In Formula (1), $R^1$, $R^2$, and $R^3$ are each a group represented by Formula (a) below. $R^1$, $R^2$, and $R^3$ may be the same or different. $R^a$, $R^b$, $R^c$, and $R^d$ are each independently a halogen atom, a hydroxy group, an amino group, or a sulfanyl group, or a monovalent organic group having 1 to 20 carbons free from aromatic ring. x, y, and z are each independently an integer of 0 to 4. w is an integer of 0 to 3. When pluralities of $R^a$ to $R^d$ exist, the plurality of $R^a$ may be the same or different, the plurality of $R^b$ may be the same or different, the plurality of $R^c$ may be the same or different, and the plurality of $R^d$ may be the same or different.

[Formula 51]

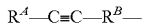     (a)

In Formula (a), $R^A$ is a hydrogen atom, an aryl group, or an alkyl group unsubstituted or substituted by at least one of a hydroxy group and an aryl group. $R^B$ is a single bond or an arylene group. A part or all of the hydrogen atoms of the aromatic rings of the aryl group and the arylene group may be each replaced by a halogen atom, a hydroxy group, an amino group, or a sulfanyl group, or a monovalent organic group having 1 to 20 carbons free from aromatic ring.

1.2.4.10. The polymer may contain a polymer having a structural unit (I) represented by Formula (1) below:

[Formula 52]

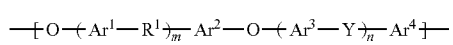     (1)

In Formula (1), $Ar^1$, $Ar^2$, $Ar^3$, and $Ar^4$ are each independently a divalent aromatic hydrocarbon group or a divalent heteroaromatic group, provided that a part or all of the hydrogen atoms contained in the aromatic hydrocarbon group and the heteroaromatic group may be replaced. $R^1$ is a single bond or a divalent hydrocarbon group having 1 to 20 carbons, provided that a part or all of the hydrogen atoms contained in the divalent hydrocarbon group having 1 to 20 carbons may be replaced. The divalent hydrocarbon group having 1 to 20 carbons may have an ester group, an ether group, or a carbonyl group in its structure. Y is a carbonyl group or a sulfonyl group. m is 0 or 1. n is 0 or 1.

1.2.4.11. The polymer may contain a polymer of the following photopolymerizable compounds:

at least one photopolymerizable compound selected from the group consisting of photopolymerizable compounds represented by General Formula (1) below and photopolymerizable compounds represented by General Formula (2) below:

[Formula 53]

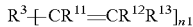     (1)

In General Formula (1), $R^{11}$ to $R^{13}$ each independently represent a monovalent group derived from an aromatic compound, a hydrogen atom, an alkyl group having 1 to 10 carbons, a cycloalkyl group having 3 to 20 carbons, a nitro group, a cyano group, $—COR^2$, $—COOR^2$, or $—CON(R^2)_2$ (with the proviso that, in $—COR^2$, $—COOR^2$, and $—CON(R^2)_2$, $R^2$ each independently represent a hydrogen atom, an alkyl group having 1 to 10 carbons, a cycloalkyl group having 3 to 20 carbons, or a monovalent organic group derived from an aromatic compound, and may be substituted), provided that any one of $R^{11}$ to $R^{13}$ is a monovalent group derived from an aromatic compound, a nitro group, a cyano group, $—COR^2$, $—COOR^2$, or $—CON(R^2)_2$. $R^3$ represents an n1-valent organic group that is derived from an aromatic compound and may be substituted. n1 represents an integer of 2 to 4.

[Formula 54]

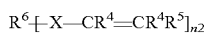     (2)

In General Formula (2), $R^4$ each independently represents a monovalent organic group derived from an aromatic compound, a hydrogen atom, an alkyl group having 1 to 10 carbons, a cycloalkyl group having 3 to 20 carbons, a nitro group, a cyano group, $—COR^7$, $—COOR^7$, or $—CON(R^7)_2$ (with the proviso that, in $—COR^7$, $—COOR^7$, or $—CON(R^7)_2$, $R^7$ each independently represent a hydrogen atom, an alkyl group having 1 to 10 carbons, a cycloalkyl group having 3 to 20 carbons, or a monovalent organic group derived from an aromatic compound, and may be substituted). $R^5$ represents a monovalent organic group that is derived from an aromatic compound and that may be substituted. $R^6$ represents an n2-valent organic group. X represents $—COO—$* or $—CONH—$* ("*" represents a bond linking to $R^6$). n2 represents an integer of 2 to 10.

1.2.4.12. The polymer may contain a polymer (A) having a naphthalene derivative structural unit represented by General Formula (1) below:

[Formula 55]

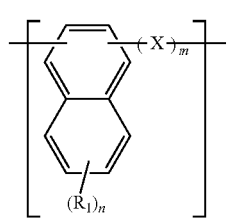     (1)

In the formula, $R_1$ represents a hydroxy group, a substitutable alkyl group having 1 to 6 carbons, a substitutable alkoxy group having 1 to 6 carbons, a substitutable alkoxycarbonyl group having 2 to 10 carbons, a substitutable aryl group having 6 to 14 carbons, or a substitutable glycidyl ether group having 2 to 6 carbons. n is an integer of 0 to 6, provided that, when n is from 2 to 6, a plurality of $R_1$ may be the same or different. X represents a methylene group, a substitutable alkylene group having 2 to 20 carbons, a substitutable arylene group having 6 to 14 carbons, or an alkylene ether group. m is an integer of 1 to 8. When m is from 2 to 8, a plurality of X may be the same or different. Furthermore, n+m is an integer from 1 to 8.

1.2.4.13. The polymer may be replaced by a compound having a partial structure represented by Formula (1) below:

[Formula 56]

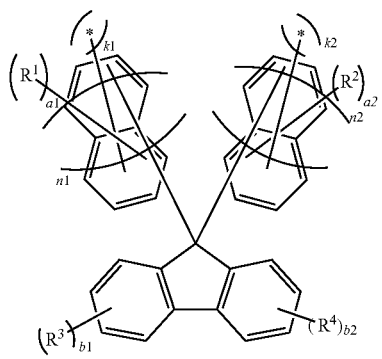
(1)

In Formula (1), $R^1$ to $R^4$ are each independently a halogen atom, a hydroxy group, a nitro group, or a monovalent organic group having 1 to 20 carbons. a1 and a2 are each independently an integer of 0 to 9. b1 and b2 are each independently an integer of 0 to 4. When pluralities of $R^1$ to $R^4$ exist, the plurality of $R^1$ may be the same or different, the plurality of $R^2$ may be the same or different, the plurality of $R^3$ may be the same or different, and the plurality of $R^4$ may be the same or different. n1 and n2 are each independently an integer of 0 to 2. k1 and k2 are each independently an integer of 0 to 9, provided that k1+k2 is 1 or greater. a1+k1 and a2+k2 are each 9 or less. * indicates a site of bonding to a moiety other than the partial structure described above.

1.2.4.14. The polymer may contain [A] a polymer having structural unit (I) represented by Formula (1) below:

[Formula 57]

(1)

In Formula (1), $Ar^1$ and $Ar^2$ are each independently a divalent group represented by Formula (2) below:

[Formula 58]

(2)

In Formula (2), $R^1$ and $R^2$ are each independently a divalent aromatic group. $R^3$ is a single bond, —O—, —CO—, —SO—, or —SO$_2$—. a is an integer of 0 to 3, provided that, when a is 2 or greater, a plurality of $R^2$ and $R^3$ may be the same or different.

1.2.4.15. The polymer may contain (A) a novolac resin, wherein the novolac resin (A) may be a resin obtained by condensing:
(a1) from 1 to 99% by mass of a compound having at least two phenolic hydroxy groups in the molecule,
(a2) from 1 to 10% by mass of naphthol,
(a3) from 0 to 98% by mass of a compound having a phenolic hydroxy group, excluding compound (a1) and naphthol (a2) defined above, provided that (a1)+(a2)+(a3)=100% by mass, and
(a4) an aldehyde.

1.2.4.16. The polymer may be a polymer (A) containing a repeating unit represented by General Formula (1) below as an essential structural unit, and further containing at least one repeating unit selected from the group consisting of a repeating unit represented by General Formula (2) below, a repeating unit represented by General Formula (3) below, and a repeating unit represented by General Formula (4) below:

[Formula 59]

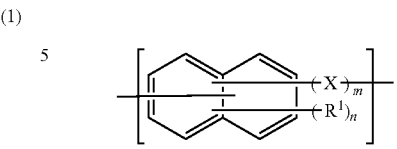
(1)

In General Formula (1) above, $R^1$ represents a hydroxy group or hydrogen, and n represents an integer of 0 to 6, provided that, when n is from 2 to 6, a plurality of $R^1$ may be the same or different. X represents a substitutable alkylene group having 1 to 20 carbons or a substitutable arylene group having 6 to 14 carbons, and m represents an integer of 1 to 8, provided that, when m is from 2 to 8, a plurality of X may be the same or different. n+m is an integer of 1 to 8.

[Formula 60]

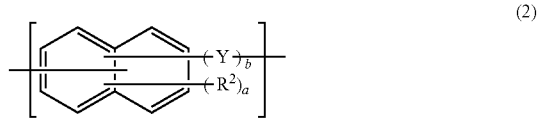
(2)

In General Formula (2) above, $R^2$ represents a substitutable alkyl group having 1 to 6 carbons, a substitutable alkenyl group having 1 to 6 carbons, a substitutable alkoxy group having 1 to 6 carbons, a substitutable alkoxycarbonyl group having 2 to 10 carbons, a substitutable aryl group having 6 to 14 carbons, or a glycidyl ether group, and a represents an integer of 0 to 6, provided that, when a is from 2 to 6, a plurality of $R^2$ may be the same or different. Y represents a substitutable alkylene group having 1 to 20 carbons or a substitutable arylene group having 6 to 14 carbons, and b represents an integer of 1 to 8, provided that, when b is from 2 to 8, a plurality of Y may be the same or different. a+b is an integer of 1 to 8.

[Formula 61]

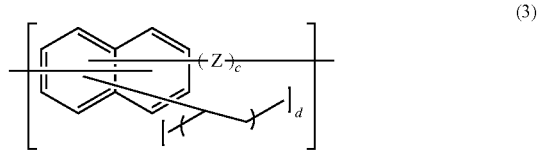
(3)

In General Formula (3) above, Z represents a substitutable alkylene group having 1 to 20 carbons or a substitutable arylene group having 6 to 14 carbons, and c represents an integer of 1 to 8, provided that, when c is from 2 to 8, a plurality of Z may be the same or different. d represents an integer of 0 to 2, and c+d is an integer of 1 to 8.

[Formula 62]

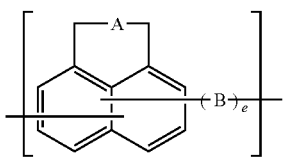
(4)

In General Formula (4) above, A represents a single bond or a double bond, B represents a substitutable alkylene group having 1 to 20 carbons or a substitutable arylene group having 6 to 14 carbons, and e represents an integer of 1 to 6.

1.2.4.17. The polymer may be (A) a resin having a group represented by General Formula (1) below and an aromatic hydrocarbon group.

[Formula 63]

$$—O(-R^1-)_n C=C—R^2 \quad (1)$$

In General Formula (1) above, n represents 0 or 1. $R^1$ represents a methylene group which may be substituted, an alkylene group having 2 to 20 carbons which may be substituted, or an arylene group having 6 to 20 carbons which may be substituted. $R^2$ represents a hydrogen atom, an alkyl group having 1 to 20 carbons which may be substituted, or an aryl group having 6 to 20 carbons which may be substituted.

1.2.4.18. The polymer may contain a polymer having a structural unit represented by Formula (1) or (2) below.

[Formula 64]

(1)

In Formula (1), $R^1$ represents a divalent organic group.

[Formula 65]

(2)

In Formula (2), $R^2$, $R^3$, and A each independently represent a divalent organic group.

1.2.4.19. The polymer may contain a polymer having a divalent group represented by Formula (1) below:

[Formula 66]

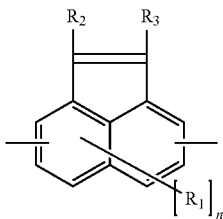
(1)

$R_1$ is a monovalent atom or group, and n is an integer of 0 to 4, provided that, when n is from 2 to 4, a plurality of $R_1$ may be the same or different. $R_2$ and $R_3$ are each independently a monovalent atom or group.

1.2.4.20. The polymer may contain an acrylonitrile polymer having a repeating unit containing at least one fluorine atom represented by General Formulas (1), and either one or both of a novolac resin having a repeating unit represented by General Formula (2) and a bisnaphthol derivative represented by General Formula (3).

[Formula 67]

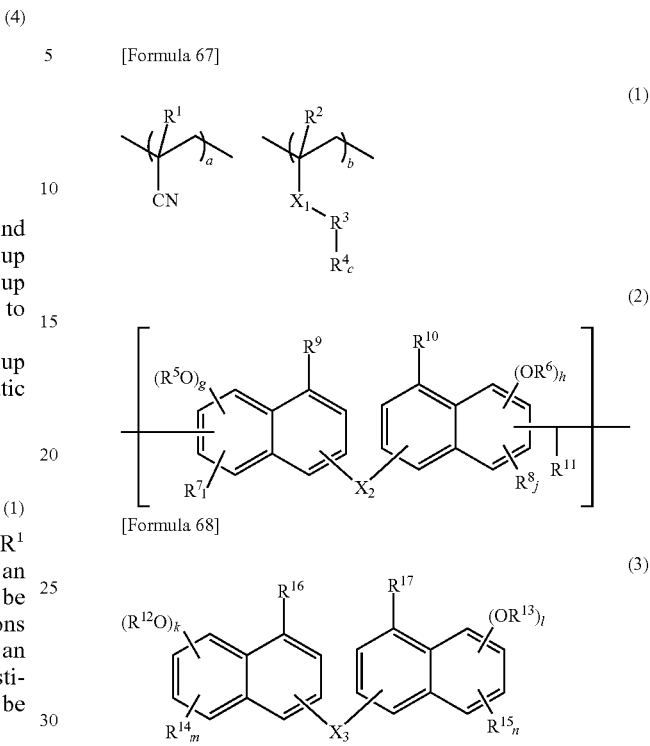

[Formula 68]

In the formulas, $R^1$ and $R^2$ are each a hydrogen atom, a fluorine atom, a methyl group, or a trifluoromethyl group. $R^3$ is a single bond, a phenylene group, or an alkylene group having 1 to 11 carbons. $R^4$ is a fluorine atom, or a straight, branched, or cyclic alkyl group having 1 to 10 carbons, an alkenyl group having 2 to 10 carbons, or an aryl group having 6 to 10 carbons, which carry at least one fluorine atom. These groups may have a hydroxy group, an alkoxy group, an acyl group, a sulfoxide group, a sulfone group, or a sulfonamide group. $R^5$, $R^6$, $R^{12}$, and $R^{13}$ are each any one of a hydrogen atom, an acid-labile group, and a glycidyl group, or a straight, branched, or cyclic alkyl group, acyl group, or alkoxycarbonyl group having 1 to 10 carbons. $R^7$ and $R^8$ are each any one of a hydrogen atom, a hydroxy group, and an alkoxy group having 1 to 4 carbons, or a straight, branched, or cyclic alkyl group having 1 to 10 carbons, alkenyl group having 2 to 10 carbons, or aryl group having 6 to 10 carbons, which may have a hydroxy group, an alkoxy group, an acyloxy group, an ether group, or a sulfide group. $R^{14}$ and $R^{15}$ are each the similar group as for $R^7$ and $R^8$ or a halogen atom. $R^9$, $R^{10}$, $R^{16}$, and $R^{17}$ are each a hydrogen atom, or $R^9$ and $R^{10}$ and $R^{16}$ and $R^{17}$ are bound to form an ether bond. $R^{11}$ is a hydrogen atom, or an alkyl group having 1 to 6 carbons, alkenyl group having 2 to 10 carbons, or aryl group having 6 to 10 carbons, which may have a hydroxy group, an alkoxy group, an acyloxy group, an ether group, a sulfide group, a chloro group, or a nitro group. $X_1$ is a phenylene group, an ether group, or an ester group. $X_2$ and $X_3$ are each a single bond or a straight, branched, or cyclic divalent hydrocarbon group having 1 to 38 carbons, which may have a hydroxy group, a carboxyl group, an ether group, or a lactone ring. When $X_2$ is a divalent hydrocarbon group, $R^9$ and $R^{10}$ may be bound to a carbon atom in $X_2$ to form an ether bond. When $X_3$ is a divalent hydrocarbon group, $R^{16}$ and $R^{17}$ may be bound to a carbon atom in $X_3$ to form an ether bond. a and b satisfy $0<a\leq1.0$ and $0\leq b<1.0$, provided that, when $R^1$ contains no fluorine atom, a and b satisfy $0<a<1.0$ and $0<b<1.0$. c is an integer of $1\leq c\leq6$, and when c is 2 or greater, c quantity of hydrogen atoms of $R^3$ are substituted by $R^4$. g, h, i, j, k, l, m, and n are each 1 or 2.

1.2.4.21. The polymer may be replaced by a compound represented by General Formula (1A):

[Formula 69]

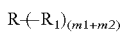  (1A)

In the formula, R is a single bond, an organic group having 1 to 50 carbons, an ether bond, an —SO— group, or an —$SO_2$— group, $R_1$ is a group represented by General Formula (1B) below, and m1 and m2 are each an integer satisfying $1\leq m1\leq5$, $1\leq m2\leq5$, and $2\leq m1+m2\leq8$.

[Formula 70]

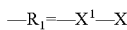  (1B)

In the formula, $X^1$ is a group represented by General Formulas (1C) below, and X is a group represented by General Formulas (1D) below:

[Formula 71]

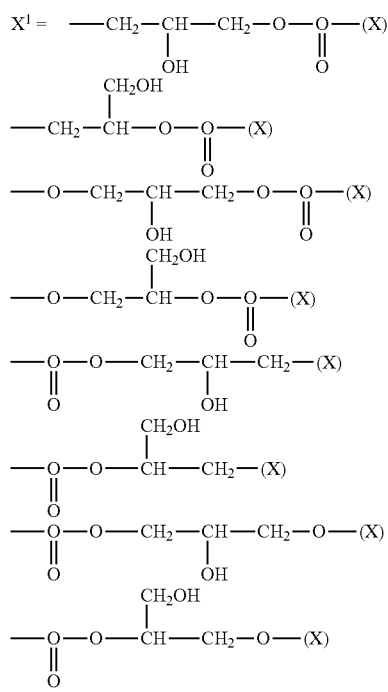

In the formulas, (X) represents a site of bonding to X above.

[Formula 72]

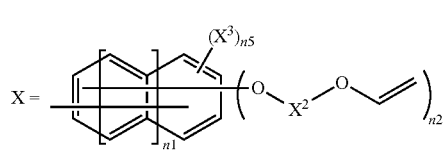

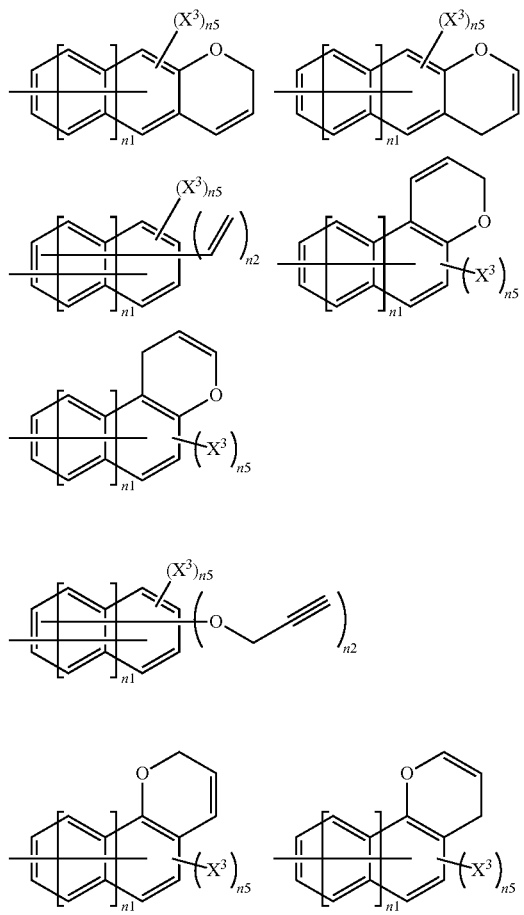

In the formulas, $X^2$ is a divalent organic group having 1 to 10 carbons, n1 is 0 or 1, n2 is 1 or 2, $X^3$ is a group represented by General Formula (1E) below, and n5 is 0, 1, or 2.

[Formula 73]

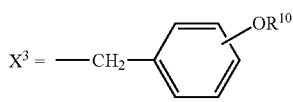  (1E)

In the formula, $R^{10}$ is a hydrogen atom or a saturated or unsaturated hydrocarbon group having 1 to 10 carbons, and the hydrogen atom on the benzene nucleus in the formula may be replaced by a methyl group or a methoxy group.

1.2.4.22. The polymer may be replaced by a compound represented by General Formula (1A) below:

[Formula 74]

  (1A)

In the formula, R is a single bond or an organic group having 1 to 50 carbons, X is a group represented by General Formulas (1B) below, and m1 is an integer satisfying $2\leq m1\leq10$.

[Formula 75]

(1B)

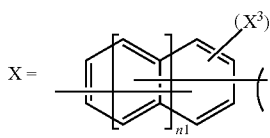
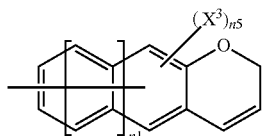
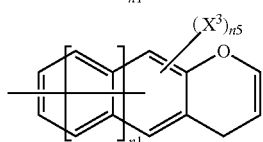
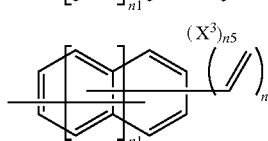
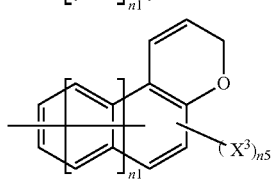
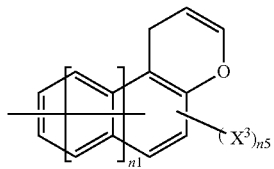
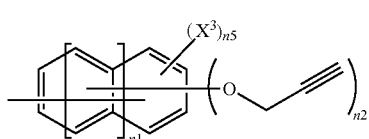
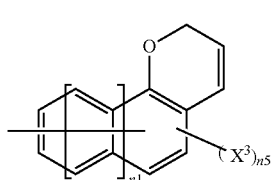
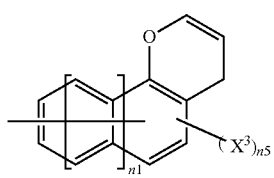

In the formulas, $X^2$ is a divalent organic group having 1 to 10 carbons, n1 is 0 or 1, n2 is 1 or 2, $X^3$ is a group represented by General Formula (1C) below, and n5 is 0, 1, or 2.

[Formula 76]

(1C)

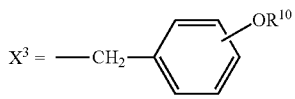

In the formula, $R^{10}$ is a hydrogen atom or a saturated or unsaturated hydrocarbon group having 1 to 10 carbons, and the hydrogen atom on the benzene nucleus in the formula may be replaced by a methyl group or a methoxy group.

1.2.4.23. The polymer may be replaced by a compound represented by General Formula (1) below:

[Formula 77]

(1)

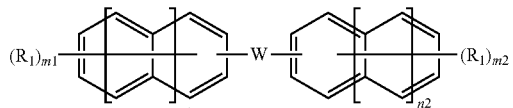

In the formula, n1 and n2 each independently represent 0 or 1, and W is a single bond or any one of structures represented by Formulas (2) below. $R_1$ is any one of structures represented by General Formulas (3) below, and m1 and m2 each independently represent an integer of 0 to 7, provided that, m1+m2 is from 1 to 14.

[Formula 78]

(2)

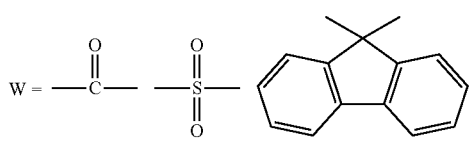

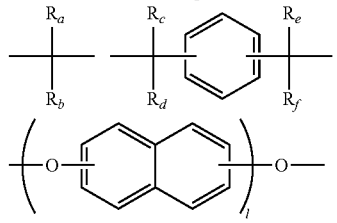

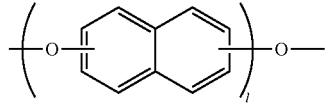

In the formulas, l represents an integer of 0 to 3, $R_a$ to $R_f$ each independently represent a hydrogen atom, an alkyl group having 1 to 10 carbons, a phenyl group, or a phenylethyl group, which may be substituted by fluorine, and $R_a$ and $R_b$ may be bonded to form a cyclic compound.

[Formula 79]

(3)

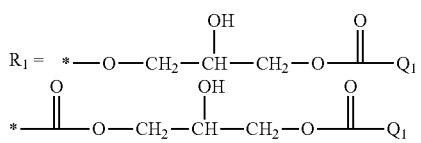

-continued

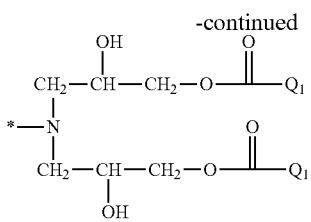

[Formula 81]

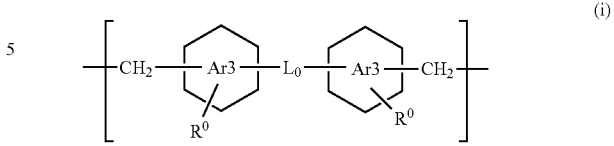

(i)

In the formulas, * represents a site of bonding to an aromatic ring, $Q_1$ represents a straight or branched, saturated or unsaturated hydrocarbon group having 1 to 30 carbons, an alicyclic group having 4 to 20 carbons, or a substituted or unsubstituted phenyl group, naphthyl group, anthracenyl group, or pyrenyl group. When $Q_1$ represents a straight or branched, saturated or unsaturated hydrocarbon group having 1 to 30 carbons, a methylene group constituting $Q_1$ may be substituted by an oxygen atom or a carbonyl group.

1.2.4.24. The polymer may be a polymer compound having a partial structure represented by General Formula (i) below and having a repeating unit represented by General Formula (vi) below:

[Formula 80]

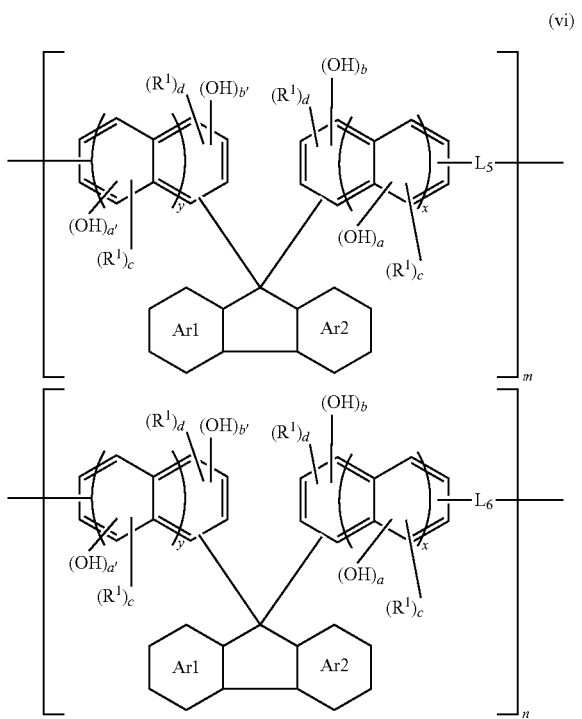

In the formula, ring structures Ar1 and Ar2 each represent a substituted or unsubstituted benzene ring or naphthalene ring. $R^1$ is a straight, branched, or cyclic monovalent hydrocarbon group having 1 to 20 carbons, and a methylene group constituting $R^1$ may be substituted by an oxygen atom. a+b and a'+b' are each independently 1, 2, or 3. c, d, c', and d' are each independently 0, 1, or 2. x and y each independently represent 0 or 1. When x=0, a=c=0, and when y=0, a'=c'=0. $L_5$ is a straight, branched, or cyclic divalent organic group having 1 to 20 carbons, $L_6$ is a partial structure represented by General Formula (i) below, 0≤m<1, 0<n≤1, and m+n=1.

In the formula, ring structure Ar3 represents a substituted or unsubstituted benzene ring or naphthalene ring. $R^0$ is a hydrogen atom or a straight, branched, or cyclic monovalent organic group having 1 to 30 carbons, $L_0$ is a straight, branched, or cyclic divalent organic group having 1 to 32 carbons, and a methylene group constituting $L_0$ may be substituted by an oxygen atom or a carbonyl group.

1.2.4.25. The polymer may be replaced by a biphenyl derivative represented by General Formula (1) below:

[Formula 82]

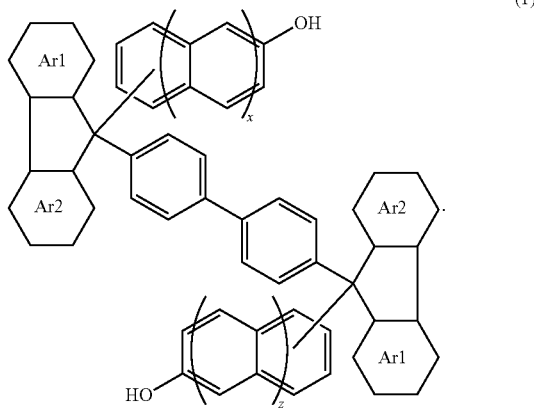

In the formula, ring structures Ar1 and Ar2 each represent a benzene ring or a naphthalene ring. x and z each independently represent 0 or 1.

1.2.4.26. The polymer may be a biphenyl derivative having a partial structure represented by General Formula (2) below:

[Formula 83]

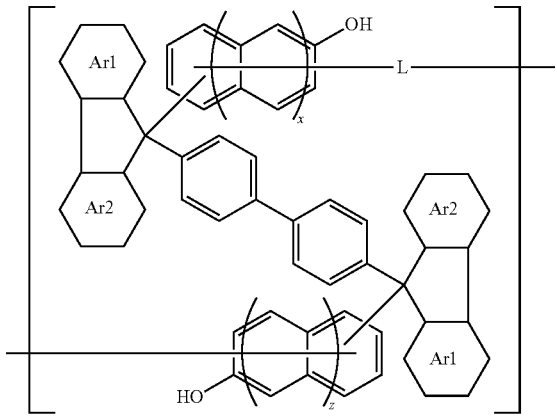

In the formula, ring structures Ar1 and Ar2 each represent a benzene ring or a naphthalene ring. x and z each independently represent 0 or 1. L represents a single bond or an alkylene group having 1 to 20 carbons.

1.2.4.27. The polymer may be a polyfluorene having at least a repeating unit a1 represented by General Formula (1) below:

[Formula 84]

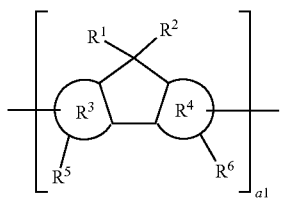

(1)

In General Formula (1), $R^1$ and $R^2$ are the same or different and are each a hydrogen atom, a hydroxyl group, an acyl group having 1 to 6 carbons, an alkoxy group having 1 to 6 carbons, an alkoxycarbonyl group having 1 to 6 carbons, a carbonyl group, an amino group, an acid-labile group, a glycidyl group, a straight, branched, or cyclic alkyl group having 1 to 10 carbons, an aryl group having 6 to 20 carbons, an alkenyl group having 2 to 10 carbons, an alkynyl group having 2 to 10 carbons, a carboxyl group, or a cyano group, or $R^1$ and $R^2$ may be combined to be one group, and in such a case, $R^1$ and $R^2$ are an oxygen atom, an alkylidene group having 1 to 6 carbons, or an imino group. These groups may each have one or more of a hydroxyl group, an acyl group having 1 to 6 carbons, an alkoxy group having 1 to 6 carbons, an alkoxycarbonyl group having 1 to 6 carbons, a straight, branched, or cyclic alkyl group having 1 to 10 carbons, an aryl group having 6 to 20 carbons, an alkenyl group having 2 to 20 carbons, an alkynyl group having 2 to 10 carbons, an amino group, a nitro group, a cyano group, an acid-labile group, a glycidyl group, or a carboxyl group. $R^3$ and $R^4$ are each a benzene ring or a naphthalene ring, $R^5$ and $R^6$ are each a hydrogen atom, a straight, branched, or cyclic alkyl group having 1 to 10 carbons, an aryl group having 6 to 10 carbons, an alkenyl group having 2 to 10 carbons, or an alkynyl group having 2 to 10 carbons.

1.2.4.28. The polymer may be a resin obtained by forming novolac at least from a compound having a bisnaphthol group represented by General Formula (1) below:

[Formula 85]

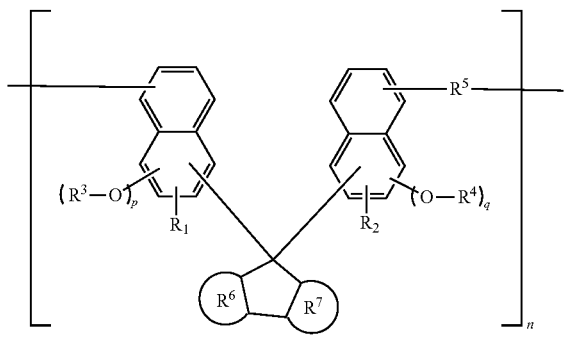

(1)

In General Formula (1), $R^1$ and $R^2$ are the same or different and are each a hydrogen atom, a straight, branched, or cyclic alkyl group having 1 to 10 carbons, an aryl group having 6 to 20 carbons, or an alkenyl group having 2 to 20 carbons. $R^3$ and $R^4$ are each a hydrogen atom or a glycidyl group. $R^5$ is a single bond, a straight or branched alkylene group having 1 to 10 carbons. $R^6$ and $R^7$ are each a benzene ring or a naphthalene ring. p and q are each 1 or 2. n meets $0 < n \le 1$.

1.2.4.29. The polymer may be a polymer represented by General Formulas (2) below.

[Formula 86]

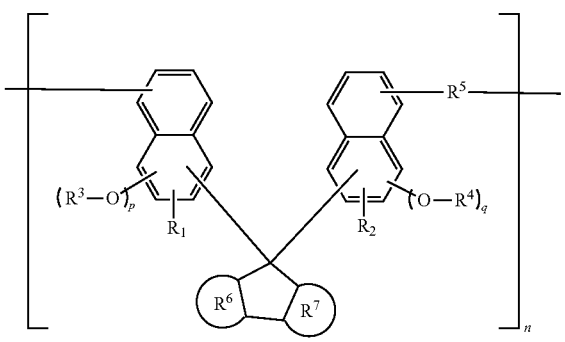

(2)

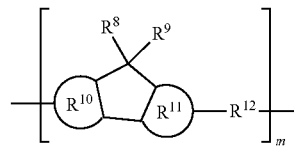

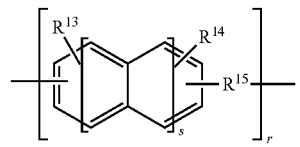

In General Formulas (2), $R^1$ to $R^7$, p, and q are as described above. $R^8$ and $R^9$ are each a hydrogen atom, a hydroxy group, an acyl group having 1 to 6 carbons, an alkoxy group having 1 to 6 carbons, an alkoxycarbonyl group having 1 to 6 carbons, a carbonyl group, an amino group, an imino group, a hydroxy group that is substituted by an acid-labile group or a glycidyl group, or a straight, branched, or cyclic alkyl group having 1 to 10 carbons, an aryl group having 6 to 20 carbons, an alkenyl group having 2 to 10 carbons, an alkynyl group having 2 to 10 carbons. $R^{10}$ and $R^{11}$ are each a benzene ring or a naphthalene ring, $R^{13}$ and $R^{14}$ are each a hydrogen atom, a hydroxy group, a straight, branched, or cyclic alkyl group having 1 to 10 carbons, and $R^{13}$ and $R^{14}$ may be bonded to form a ring. $R^{12}$ and $R^{15}$ are each a straight or branched alkylene group having 1 to 10 carbons. s is 1 or 2. $0 < n < 1.0$, $0 \le m < 1.0$, $0 \le r < 1.0$, and $0 < m + r < 1.0$.

1.2.4.30. The polymer may be replaced by a compound having a bisphenol group represented by General Formula (1) below:

[Formula 87]

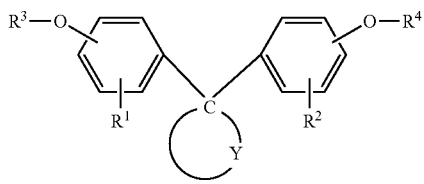

(1)

In the formula, $R^1$ and $R^2$ are the same or different and are each a hydrogen atom, a straight, branched, or cyclic alkyl group having 1 to 10 carbons, an aryl group having 6 to 10 carbons, or an alkenyl group having 2 to 10 carbons. $R^3$ and $R^4$ are each a hydrogen atom, a straight, branched, or cyclic alkyl group having 1 to 6 carbons, a straight, branched, or cyclic alkenyl group having 2 to 6 carbons, an aryl group having 6 to 10 carbons, an acetal group having 2 to 6 carbons, an acyl group having 2 to 6 carbons, or a glycidyl group. Y is a divalent aliphatic or alicyclic hydrocarbon group having 4 to 30 carbons, and the ring represented by

[Formula 88]

may be a bridged ring or may be interrupted by a heteroatom.

1.2.4.31. The polymer may be a resin having a repeating unit obtained by forming novolac from a compound having a bisphenol group represented by General Formula (2) below:

[Formula 89]

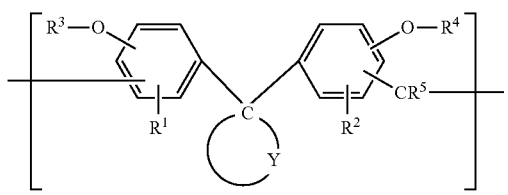

(2)

In the formula, $R^1$ and $R^2$ are the same or different and are each a hydrogen atom, a straight, branched, or cyclic alkyl group having 1 to 10 carbons, an aryl group having 6 to 10 carbons, or an alkenyl group having 2 to 10 carbons. $R^3$ and $R^4$ are each a hydrogen atom, a straight, branched, or cyclic alkyl group having 1 to 6 carbons, a straight, branched, or cyclic alkenyl group having 2 to 6 carbons, an aryl group having 6 to 10 carbons, an acetal group having 2 to 6 carbons, an acyl group having 2 to 6 carbons, or a glycidyl group. Y is a divalent aliphatic or alicyclic hydrocarbon group having 4 to 30 carbons, and the ring represented by

[Formula 90]

may be a bridged ring or may be interrupted by a heteroatom. $R^5$ is a hydrogen atom, a straight, branched, or cyclic alkyl group having 1 to 10 carbons, or an aryl group having 6 to 10 carbons.

1.2.4.32. The polymer may be a polymer, in which at least a repeating unit from acenaphthylenes and a repeating unit containing a substituted or unsubstituted hydroxy group are copolymerized, and the polymer may contain repeating units represented by General Formula (1) below:

[Formula 91]

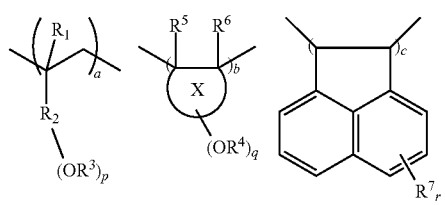

(1)

In General Formula (1) above, $R^1$ is a hydrogen atom or a methyl group. $R^2$ is any one of a single bond, a straight, branched, or cyclic alkylene group having 1 to 20 carbons, and an arylene group having 6 to 10 carbons, and may have any one of ether, ester, lactone, and amide. $R^3$ and $R^4$ are each a hydrogen atom or a glycidyl group. X represents a polymer of any one of a hydrocarbon containing an indene skeleton, a cycloolefin having 3 to 10 carbons, and maleimide, and may have ether, ester, lactone, or carboxylic anhydride. $R^5$ and $R^6$ are each any one of a hydrogen atom, a fluorine atom, a methyl group, and a trifluoromethyl group. $R^7$ is any one of a hydrogen atom, a straight, branched, or cyclic alkyl group having 1 to 6 carbons, a hydroxy group, or an alkoxycarbonyl group. p and q are each an integer of 1 to 4. r is an integer of 0 to 4. a, b, and c each satisfy $0.5 \leq a+b+c \leq 1$, $0 \leq a \leq 0.8$, $0 \leq b \leq 0.8$, $0.1 \leq a+b \leq 0.8$, and $0.1 \leq c \leq 0.8$.

1.2.4.33. The polymer may be a novolac resin having a fluorene or tetrahydrospirobiindene structure.

The novolac resin having a fluorene or tetrahydrospirobiindene structure may contain a repeating unit represented by General Formula (1a) or (1b) below:

[Formula 92]

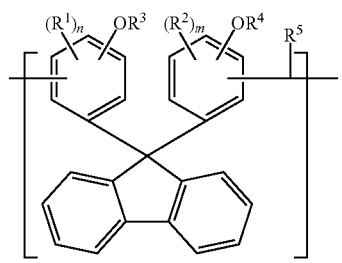

(1a)

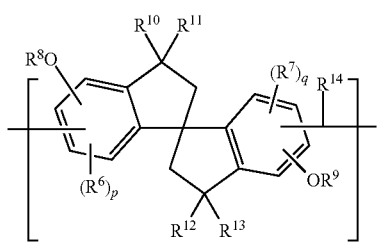

(1b)

In the formula, $R^1$, $R^2$, $R^6$, and $R^7$ are each independently a hydrogen atom, a straight, branched, or cyclic alkyl group having 1 to 10 carbons, an aryl group having 6 to 10 carbons, an allyl group, or a halogen atom. $R^3$, $R^4$, $R^8$, and $R^9$ are each independently a hydrogen atom, a straight, branched, or cyclic alkyl group having 1 to 6 carbons, a straight, branched, or cyclic alkenyl group having 2 to 6 carbons, an aryl group having 6 to 10 carbons, or a glycidyl group. $R^5$ and $R^{14}$ are each independently a hydrogen atom, a straight, branched, or cyclic alkyl group having 1 to 10 carbons, or an aryl group having 6 to 10 carbons. n, m, p, and q are each an integer of 1 to 3. $R^{10}$ to $R^{13}$ are each independently a hydrogen atom, a halogen atom, a hydroxy group, a straight, branched, or cyclic alkyl group having 1 to 6 carbons, or a straight, branched, or cyclic alkoxy group having 1 to 6 carbons.

1.1.3. Other Additives

A surfactant may be incorporated into the resist underlayer film material for lithography according to the present invention to further enhance the coatability so as to avoid surface irregularity and to prevent occurrence of pinholes, striations, or the like. Examples of the surfactant include nonionic surfactants, including polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and the like; fluorine-based surfactants, such as EFTOP EF301, EF303, and EF352 (trade names; manufactured by Tohkem Products Corporation), MEGAFACE F171, F173, R-40, R-40N, and R-40LM (trade names; manufactured by DIC Corporation), Fluorad FC430 and FC431 (trade names; manufactured by Sumitomo 3M Limited), Asahi Guard AG710, and SURFLON S-382, SC101, SC102, SC103, SC104, SC105, and SC106 (trade names; manufactured by Asahi Glass Co., Ltd.); and an organosiloxane polymer KP341 (manufactured by Shin-Etsu Chemical Co., Ltd.); and the like. These surfactants is incorporated usually in an amount of 2.0% by mass or less, and preferably 1.0% by mass or less, relative to the total solid content of the resist underlayer film material. The surfactant may be used alone or in combination of two or more. When a surfactant is used, the proportion of the surfactant ranges from 0.0001 to 5 parts by mass, from 0.001 to 1 part by mass, or 0.01 to 0.5 parts by mass, per 100 parts by mass of the solid content of the resist underlayer film-forming composition.

The resist underlayer film-forming composition according to the present invention may contain a crosslinking agent component. Examples of the crosslinking agent include melamine-based crosslinking agents, substituted urea-based crosslinking agents, crosslinking agents based on the polymers of these, and the like. The crosslinking agent is preferably a crosslinking agent containing at least two crosslinking substituents, and examples thereof include such compounds as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, and methoxymethylated thiourea. A condensate of these compounds may be also used.

As the crosslinking agent, a crosslinking agent having high heat resistance may be used. As the crosslinking agent having high heat resistance, a compound containing a crosslinking substituent having an aromatic ring (e.g., a benzene ring, a naphthalene ring) in the molecule may be preferably used.

Examples of the compound include a compound having a partial structure of Formula (4) below and a polymer or oligomer having a repeating unit of Formula (5) below:

[Formula 93]

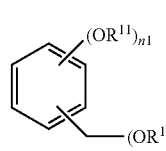

Formula (4)

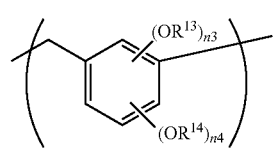

Formula (5)

$R^{11}$, $R^{12}$, $R^{13}$, and $R^{14}$ are each a hydrogen atom or an alkyl group having 1 to 10 carbons, and examples of the alkyl group include those described above.

Examples of the compounds of Formulas (4) and (5), the polymer, and the oligomer are as follows.

[Formula 94]

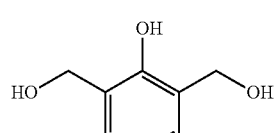

Formula (4-1)

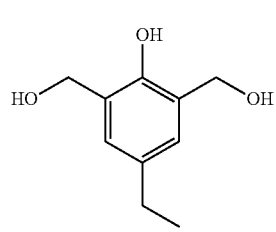

Formula (4-2)

Formula (4-3)

Formula (4-4)

Formula (4-5)

Formula (4-6)

Formula (4-7)

Formula (4-8)

Formula (4-9)

Formula (4-10)

Formula (4-11)

Formula (4-12)

Formula (4-13)

Formula (4-14)

Formula (4-15)

[Formula 95]

Formula (4-16)
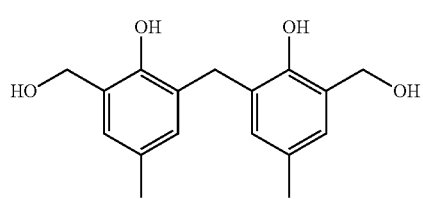

Formula (4-17)
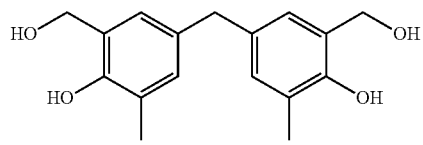

Formula (4-18)
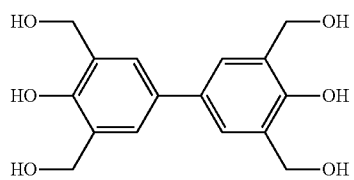

Formula (4-19)
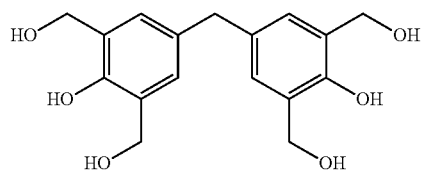

Formula (4-20)
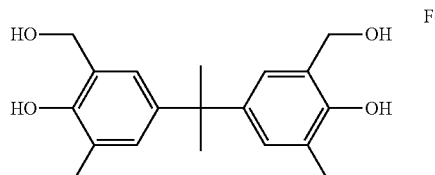

Formula (4-21)
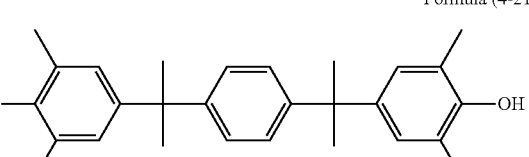

Formula (4-22)
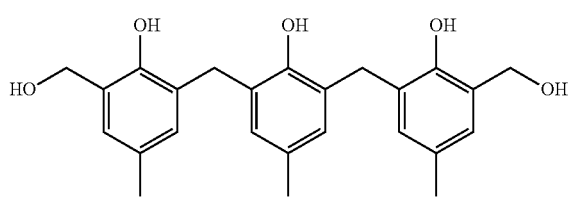

Formula (4-23)
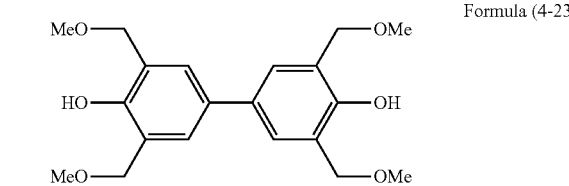

Formula (4-24)
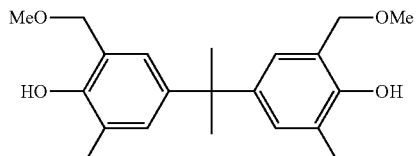

Formula (4-25)

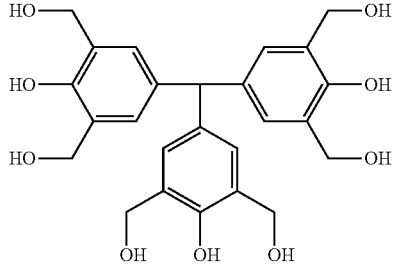

Formula (4-26)
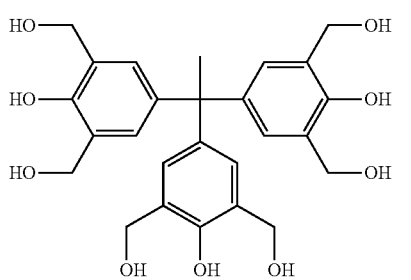

Formula (4-27)
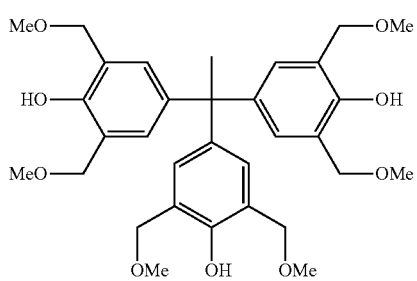

The compounds described above are commercially available products from Asahi Yukizai Corporation, and Honshu Chemical Industry Co., Ltd. For example, of the crosslinking agents, the compound of Formula (4-24) is available as TM-BIP-A (trade name) from Asahi Yukizai Corporation.

The added amount of the crosslinking agent may vary depending upon the coating solvent to be used, the base substrate to be used, the required solution viscosity, and the required film form; however, it ranges from 0.001 to 80% by mass, preferably from 0.01 to 50% by mass, and more preferably from 0.05 to 40% by mass, relative to the total solid content. These crosslinking agents may induce crosslinking reaction by self-condensation; however, the presence of a crosslinkable substituent in the polymer according to the present invention may cause crosslinking reaction between the crosslinkable substituent and the crosslinking agent.

In the present invention, an acid and/or an acid generating agent may be incorporated as a catalyst to promote the crosslinking reaction. For example, an acidic compound, such as p-toluenesulfonic acid, trifluoromethanesulfonic acid, pyridinium p-toluenesulfonic acid, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, and naphthalenecarboxylic acid, and/or a thermal acid generating agent, such as 2,4,4,6-tetrabromocyclohexadienone, benzoin tosylate, 2-nitrobenzyl tosylate, and the other organic alkyl sulfonate, may be incorporated. The amount incorporated ranges from 0.0001 to 20% by mass, preferably from 0.0005 to 10% by mass, and more preferably from 0.01 to 3% by mass, relative to the total solid content.

The resist underlayer film-forming composition according to the present invention may contain an acid generating agent.

Examples of an acid generating agent include thermal acid generating agents and photo acid generating agents.

The photo acid generating agent generates an acid at the time when the resist is exposed to light. Therefore, the acidity of the underlayer film can be adjusted. This is a method to adjust the acidity of the underlayer film to the acidity of the resist of the upper layer. Furthermore, by adjusting the acidity of the underlayer film, the pattern shape of the resist formed on the upper layer can be adjusted.

Examples of the photo acid generating agent contained in the resist underlayer film-forming composition according to the present invention includes onium salt compounds, sulfonimide compounds, disulfonyl diazomethane compounds, and the like.

Examples of the onium salt compound include iodonium salt compounds, such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; sulfonium salt compounds, such as triphenylsulfonium hexafluoroantimonate, triphenylsulfonium nonafluoro-n-butanesulfonate, triphenylsulfonium camphorsulfonate, and triphenylsulfonium trifluoromethanesulfonate; and the like.

Examples of the sulfonimide compound include N-(trifluoromethane sulfonyloxy)succinimide, N-(nonafluoro-n-butanesulfonyloxy)succinimide, N-(camphorsulfonyloxy)succinimide, N-(trifluoromethanesulfonyloxy)naphthalimide, and the like.

Examples of the disulfonyl diazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, methylsulfonyl-p-toluenesulfonyl diazomethane, and the like.

The photo acid generating agent may be used alone or in combination of two or more.

When the photo acid generating agent is used, the proportion thereof ranges from 0.01 to 5 parts by mass, from 0.1 to 3 parts by mass, or from 0.5 to 1 part by mass, per 100 parts by mass of the solid content of the resist underlayer film-forming composition.

To the resist underlayer film material for lithography according to the present invention, a light absorbing agent, a rheology modifier, an adhesive auxiliary agent, and the like may be added. A rheology modifier is effective for enhancing the fluidity of the underlayer film-forming composition. An adhesive auxiliary agent is effective for enhancing the adhesion between the underlayer film and a semiconductor substrate or a resist.

As the light absorbing agent, for example, commercially available light absorbing agents mentioned in "Kogyoyoshikiso no gijutsu to shijo" (CMC Publishing Co., Ltd.) or "Senryo binran" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; C. I. Pigment Brown 2; and the like, may be preferably used. The proportion of the light absorbing agent incorporated range usually 10% by mass or less, and preferably 5% by mass or less, relative to the total solid content of the resist underlayer film material for lithography.

The rheology modifier is added to mainly enhance the flowability of the resist underlayer film-forming composition, and in particular, to enhance the film thickness uniformity of a resist underlayer film and enhance the packing properties of the resist underlayer film-forming composition inside of the holes during a baking step. Specific examples thereof include phthalic acid derivatives, such as dimethyl phthalate, diethyl phthalate, diisobutyl phthalate, dihexyl phthalate, and butylisodecyl phthalate; adipic acid derivatives, such as di-n-butyl adipate, diisobutyl adipate, diisooctyl adipate, and octyldecyl adipate; maleic acid derivatives, such as di-n-butyl maleate, diethyl maleate, and dinonyl maleate; oleic acid derivatives, such as methyl oleate, butyl oleate, and tetrahydrofurfuryl oleate; and stearic acid derivatives, such as n-butyl stearate and glyceryl stearate. The rheology modifier is usually incorporated in a proportion of less than 30% by mass relative to the total solid content of the resist underlayer film material for lithography.

The adhesive auxiliary agent is added to mainly enhance the adhesion of the resist underlayer film-forming composition to a substrate or a resist, and in particular, to prevent peeling of the resist in development. Specific examples thereof include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea, such as 1,1-dimethylurea and 1,3-dimethylurea, and thiourea compounds. The adhesive auxiliary agent is usually incorporated in a proportion of less than 5% by mass, and preferably less than 2% by mass, relative to the total solid content of the resist underlayer film material for lithography.

The amount incorporated of the compound represented by Formula (1) above is not particularly limited, because the compound is effective even added in a very small amount to the resist underlayer film-forming composition. Preferably, the resist underlayer film-forming composition according to the present invention contains at least 5% by weight of the compound represented by Formula (1) relative to the total weight of the composition. Also, preferably, it contains at most 30% by weight of the compound represented by Formula (1) relative to the total weight of the composition.

The solid content of the resist underlayer film-forming composition according to the present invention usually falls within the range of from 0.1 to 70% by mass, and preferably within the range of from 0.1 to 60% by mass. The solid content refers to the content proportion of all the components of the resist underlayer film-forming composition except the solvent. The proportion of the polymer described below in the solid content is, in the preferred order, 1 to 100% by mass, 1 to 99.9% by mass, 50 to 99.9% by mass, 50 to 95% by mass, and 50 to 90% by mass.

One criterion to determine if a resist underlayer film-forming composition is in a uniform solution state or not is to observe the passing capability through a particular microfilter. The resist underlayer film-forming composition according to the present invention passes through a microfilter having a pore diameter of 0.1 μm and is decided to be in a uniform solution state.

Examples of a material for the microfilter include fluororesins, such as polytetrafluoroethylene (PTFE), tetrafluoroethylene perfluoroalkyl vinyl ether copolymers (PFA); polyethylene (PE), ultra high molecular weight polyethylene (UPE), polypropylene (PP), polysulfone (PSF), polyethersulfone (PES), and nylon. The microfilter is preferably manufactured of polytetrafluoroethylene (PTFE).

2. Method for Producing Resist Underlayer Film and Semiconductor Device

The resist underlayer film obtained using the resist underlayer film-forming composition according to the present invention and the method for producing a semiconductor device will be described below.

The resist underlayer film according to the present invention can be produced by coating the resist underlayer film-forming composition described above on a semiconductor substrate and baking.

The resist underlayer film-forming composition according to the present invention is coated on a substrate for use in the production of a semiconductor device (e.g., silicon wafer substrates, substrates coated with silicon/silicon dioxide, silicon nitride substrates, glass substrates, ITO substrates, polyimide substrates, and substrates coated with a low dielectric constant material (low-k material)) by an appropriate coating method, such as a spinner or a coater, and is then baked to form a resist underlayer film. The baking conditions are appropriately selected from baking temperatures of 80° C. to 250° C. and baking times of 0.3 to 60 minutes. Preferably, the baking temperature is from 150° C. to 250° C. and the baking time is from 0.5 to 2 minutes. Here, the film thickness of the formed underlayer film falls within the range of, for example, from 10 to 1000 nm, 20 to 500 nm, 50 to 300 nm, or 100 to 200 nm.

Moreover, an inorganic resist underlayer film (hardmask) may be formed on the organic resist underlayer film according to the present invention. For example, the inorganic resist underlayer film may be formed by a method comprising applying a silicon-containing resist underlayer film (inorganic resist underlayer film) forming composition described in WO 2009/104552 A1 by spin coating, by a CVD method comprising applying a Si-based inorganic material film, or the like.

Furthermore, by coating the resist underlayer film-forming composition according to the present invention on a semiconductor substrate having a part having a step and a part having no step (the so-called stepped substrate) and baking, a resist underlayer film having a step between the part having a step and the part having no step of 3 to 50 nm can be formed.

Subsequently, for example, a photoresist layer is formed on the resist underlayer film. The photoresist layer may be formed by a known method, that is, by coating a photoresist composition solution onto the underlayer film and baking. The film thickness of the photoresist falls within the range of, for example, from 50 to 10000 nm, 100 to 2000 nm, or 200 to 1000 nm.

The photoresist formed on the resist underlayer film is not particularly limited so long as the photoresist is sensitive to light used for exposure. Both a negative photoresist and a positive photoresist may be used. Examples of the photoresist include a positive photoresist formed from a novolac resin and a 1,2-naphthoquinonediazide sulfonic acid ester; a chemical amplification-type photoresist formed from a binder having a group elevating the alkali dissolving rate by being decomposed by an acid, and a photoacid generator; a chemical amplification-type photoresist formed from a low molecular weight compound elevating the alkali dissolving rate of the photoresist by being decomposed by an acid, an alkali-soluble binder, and a photoacid generator; a chemical amplification-type photoresist formed from a binder having a group elevating the alkali dissolving rate by being decomposed by an acid, a low molecular weight compound elevating the alkali dissolving rate of the photoresist by being decomposed by an acid, and a photoacid generator; and the like. Examples of the photoresist include trade name: APEX-E manufactured by Shipley Company, L.L.C., trade name: PAR710 manufactured by Sumitomo Chemical Co., Ltd., trade name: SEPR430 manufactured by Shin-Etsu Chemical Co., Ltd., and the like. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, near-ultraviolet light, far-ultraviolet light, extreme-ultraviolet light (e.g., EUV (wavelength: 13.5 nm)) or the like is used. Specifically, a KrF excimer laser (wavelength: 248 nm), an ArF excimer laser (wavelength: 193 nm), an $F_2$ excimer laser (wavelength: 157 nm), or the like can be used. Of these, an ArF excimer laser (wavelength: 193 nm) and EUV (wavelength: 13.5 nm) are preferred. After the exposure, if necessary, post exposure bake may also be performed. The post exposure bake is performed under conditions appropriately selected from baking temperatures of 70° C. to 150° C. and baking times of 0.3 to 10 minutes.

Furthermore, in the present invention, as the resist, a resist for electron beam lithography may be used in place of the photoresist. As the electron beam resist, both a positive type and a negative type may be used. Examples of the electron beam resist include a chemical amplification-type resist formed from an acid generator and a binder having a group changing the alkali dissolving rate by being decomposed by an acid; a chemical amplification-type resist formed from an alkali-soluble binder, an acid generator, and a low molecular weight compound changing the alkali dissolving rate of the resist by being decomposed by an acid; a chemical amplification-type resist formed from an acid generator, a binder having a group changing the alkali dissolving rate by being decomposed by an acid, and a low molecular weight compound changing the alkali dissolving rate of the resist by being decomposed by an acid; a non-chemical amplification-type resist formed from a binder having a group changing the alkali dissolving rate by being decomposed by an electron beam; a non-chemical amplification-type resist formed from a binder having a moiety changing the alkali dissolving rate by being broken by an electron beam; and the like. Also in the case of using the electron beam resist, a resist pattern may be formed in the manner similar to that in the case of using a photoresist by using an electron beam as the irradiation source.

Next, the development is performed by a developing solution. Thereby, for example, in the case where a positive photoresist is used, the photoresist in the portion exposed to light is removed to form a pattern of the photoresist.

Examples of the developing solution include alkaline aqueous solutions, such as aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Furthermore, in these developing solutions, a surfactant and the like may be added. The conditions for development are appropriately selected from temperatures of 5 to 50° C., and time periods of 10 to 600 seconds.

Using the formed pattern of the photoresist (upper layer) as a protecting film, removal of the inorganic underlayer film (intermediate layer) is performed and then, using the film formed from the patterned photoresist and the patterned inorganic underlayer film (intermediate layer) as a protecting film, removal of the organic underlayer film (underlayer) is performed. Finally, using the patterned inorganic underlayer film (intermediate layer) and the patterned organic underlayer film (underlayer) as a protecting film, processing of the semiconductor substrate is performed.

First, the inorganic underlayer film (intermediate layer) at the part where the photoresist has been removed is removed by dry etching to expose the semiconductor substrate. For dry etching of the inorganic underlayer film, a gas, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane, or the like may be used. For dry etching of the inorganic underlayer film, a halogen-based gas is preferably used, and a fluorine-based gas is more preferably used. Examples of the fluorine-based gas include tetrafluoromethane ($CF_4$), perfluorocyclobutane ($C_4F_8$), perfluoropropane ($C_3F_8$), trifluoromethane, difluoromethane ($CH_2F_2$), and the like.

Subsequently, using the film formed from the patterned photoresist and the patterned inorganic underlayer film as a protecting film, removal of the organic underlayer film is performed. The removal of the organic underlayer film (underlayer) is preferably performed by dry etching with an oxygen-based gas. This is because the inorganic underlayer film containing a large amount of silicon atoms is difficult to be removed by dry etching with an oxygen-based gas.

Finally, the processing of the semiconductor substrate is performed. The processing of the semiconductor substrate is preferably performed by dry etching with a fluorine-based gas.

Examples of the fluorine-based gas include tetrafluoromethane ($CF_4$), perfluorocyclobutane ($C_4F_8$), perfluoropropane ($C_3F_8$), trifluoromethane, difluoromethane ($CH_2F_2$), and the like.

Furthermore, as an upper layer of the resist underlayer film, an organic anti-reflective film may be formed before the formation of the photoresist. The anti-reflective film composition used for this is not particularly limited and may be optionally selected from compositions commonly used in a conventional lithography process, and the formation of the anti-reflective film may be performed by a commonly used method, for example, by coating by a spinner or a coater and by baking.

In the present invention, after an organic underlayer film is formed on a substrate, an inorganic underlayer film may be formed thereon, and a photoresist may be coated thereon. Thus, even when the pattern width of the photoresist becomes smaller and the photoresist is coated thinly for preventing a pattern collapse, the processing of the substrate is possible by selecting an appropriate etching gas. For example, the resist underlayer film may be processed with a fluorine-based gas having an etching rate of the resist underlayer film satisfactorily higher than that of the photoresist as an etching gas. The substrate may be processed with a fluorine-based gas having an etching rate of the substrate satisfactorily higher than that of the inorganic underlayer film as an etching gas. Furthermore, the substrate may be processed with an oxygen-based gas having an etching rate of the substrate satisfactorily higher than that of the organic underlayer film as an etching gas.

Furthermore, depending on the wavelength of light used in the lithography process, the resist underlayer film formed from the resist underlayer film-forming composition may absorb the light. In such a case, the resist underlayer film may function as an anti-reflective film having an effect of preventing the reflected light from the substrate. Furthermore, the underlayer film formed from the resist underlayer film-forming composition according to the present invention may function as a hardmask. The underlayer film according to the present invention may be used as a layer to prevent interaction between a substrate and a photoresist, a layer having a function of preventing negative effects to the substrate by the materials used in a photoresist or by the substances generated at the time of exposure of the photoresist, a layer having a function to prevent diffusion of the substances generated from the substrate at the time of baking into an upper layer photoresist, a barrier layer for reducing a poisoning effect to the photoresist layer by a semiconductor substrate dielectric layer, and the like.

An underlayer film formed from the resist underlayer film-forming composition may be applied to a substrate, in which a via hole used in the dual damascene process is formed, and may be used as an embedding material capable of filling the hole without any void. Furthermore, the underlayer film may also be used as a planarizing material for planarizing the surface of a semiconductor substrate having a recess and a protrusion.

EXAMPLES

The present invention is described below in detail while referring to Examples and the like; however, the present invention is not limited to the embodiments described below.

Synthesis Example 1

[Formula 96]

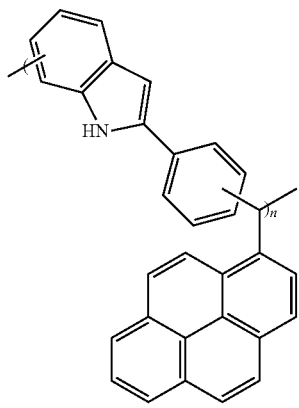

(1-1)

In a two-necked flask, 7.50 g of 2-phenylindole (manufactured by Tokyo Chemical Industry Co., Ltd.), 9.01 g of 1-pyrenecarboxaldehyde (manufactured by Aldrich), 5.29 g of propylene glycol monomethyl ether acetate, 12.34 g of N-methylpyrrolidone (manufactured by Kanto Chemical Co., Inc.), and 1.12 g of methanesulfonic acid (manufactured by Tokyo Chemical Industry Co., Ltd.) were charged. The mixture was then heated to 150° C. and refluxed for approximately 24 hours while being agitated. After the completion of the reaction, the mixture was diluted with 129.88 g of cyclohexanone. The diluted solution was added dropwise into a methanol solution to reprecipitate. The obtained precipitate was subjected to vacuum filtration, and the residue was dried overnight at 60° C. under reduced pressure. Thus, 13.4 g of compound 1 resin was obtained. The obtained polymer corresponded to Formula (1-1). The weight average molecular weight Mw, measured by GPC based on calibration with polystyrene, was 1,100.

Synthesis Example 2

[Formula 97]

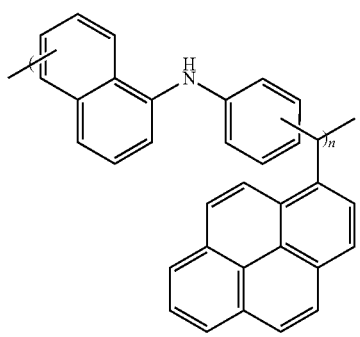

(1-2)

In a two-necked flask, 8.00 g of N-phenyl-1-naphthylamine (manufactured by Tokyo Chemical Industry Co., Ltd.), 8.47 g of 1-pyrenecarboxaldehyde (manufactured by Aldrich), 16.26 g of toluene (manufactured by Kanto Chemical Co., Inc.), 16.26 g of 1,4-dioxane (manufactured by Kanto Chemical Co., Inc.), and 1.04 g of p-toluenesulfonic acid monohydrate (manufactured by Tokyo Chemical Industry Co., Ltd.) were charged. The mixture was then heated to 155° C. and refluxed for approximately 19.5 hours while being agitated. After the completion of the reaction, the mixture was diluted with 32.31 g of cyclohexanone. The diluted solution was added dropwise into a methanol solution to reprecipitate. The obtained precipitate was subjected to vacuum filtration, and the residue was dried overnight at 60° C. under reduced pressure. Thus, 12.1 g of compound 2 resin was obtained. The obtained polymer corresponded to Formula (1-2). The weight average molecular weight Mw, measured by GPC based on calibration with polystyrene, was 1,200.

Synthesis Example 3

[Formula 98]

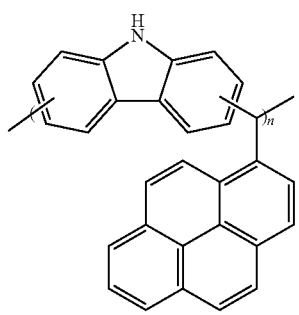

(1-3)

In a two-necked flask, 7.00 g of carbazole (manufactured by Tokyo Chemical Industry Co., Ltd.), 9.72 g of 1-pyrenecarboxaldehyde (manufactured by Aldrich), 27.48 g of propylene glycol monomethyl ether acetate, and 1.59 g of p-toluenesulfonic acid monohydrate (manufactured by Tokyo Chemical Industry Co., Ltd.) were charged. The mixture was then heated to 150° C. and refluxed for approximately 7 hours while being agitated. After the completion of the reaction, the mixture was diluted with 37.83 g of cyclohexanone. The diluted solution was added dropwise into a methanol solution to reprecipitate. The obtained precipitate was subjected to vacuum filtration, and the residue was dried overnight at 60° C. under reduced pressure. Thus, 11.0 g of compound 3 resin was obtained. The obtained polymer corresponded to Formula (1-3).

The weight average molecular weight Mw, measured by GPC based on calibration with polystyrene, was 2,100.

Synthesis Example 4

[Formula 99]

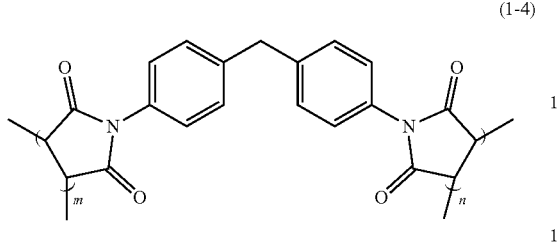

(1-4)

In a two-necked flask, 6.00 g of 4,4'-bismaleimidediphenylethane (manufactured by Tokyo Chemical Industry Co., Ltd.) and 14.00 of N-methylpyrrolidone (manufactured by Kanto Chemical Co., Inc.) were charged. The mixture was then heated to 100° C. and refluxed for approximately 1 hour while being agitated. After the completion of the reaction, the mixture was diluted with 10.00 g of N-methylpyrrolidone. The diluted solution was added dropwise into a methanol solution to reprecipitate. The obtained precipitate was subjected to vacuum filtration, and the residue was dried overnight at 60° C. under reduced pressure. Thus, 1.99 g of compound 4 resin was obtained. The obtained polymer corresponded to Formula (1-4). The weight average molecular weight Mw, measured by GPC based on calibration with polystyrene, was 6,200.

Synthesis Example 5

[Formula 100]

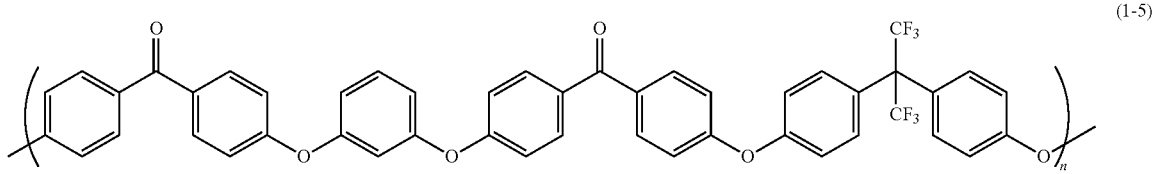

(1-5)

In a two-necked flask, 4.00 g of 4,4'-difluorobenzophenone (manufactured by Tokyo Chemical Industry Co., Ltd.), 3.08 g of 2,2-bis(4-hydroxyphenyl)hexafluoropropane (manufactured by Tokyo Chemical Industry Co., Ltd.), 1.01 g of resorcinol (manufactured by Tokyo Chemical Industry Co., Ltd.), 2.64 g of potassium carbonate (manufactured by Wako Pure Chemical Industries, Ltd.), and 25.05 g of N-methylpyrrolidone (manufactured by Kanto Chemical Co., Inc.) were charged. The mixture was then heated to 150° C. and agitated for approximately 22 hours. After the completion of the reaction, the mixture was diluted with 45.13 g of N-methylpyrrolidone, and potassium carbonate was removed by filtration. To the obtained filtrate, 1N—HCl was added to make the filtrate neutral, and then the solution was agitated for a while. This diluted solution was added dropwise into a methanol/water=90/10 (vol/vol) solution to reprecipitate. The obtained precipitate was subjected to vacuum filtration, and the residue was dried overnight at 60° C. under reduced pressure. Thus, 6.28 g of compound 5 resin was obtained. The obtained polymer corresponded to Formula (1-5). The weight average molecular weight Mw, measured by GPC based on calibration with polystyrene, was 8,800.

Synthesis Example 6

[Formula 101]

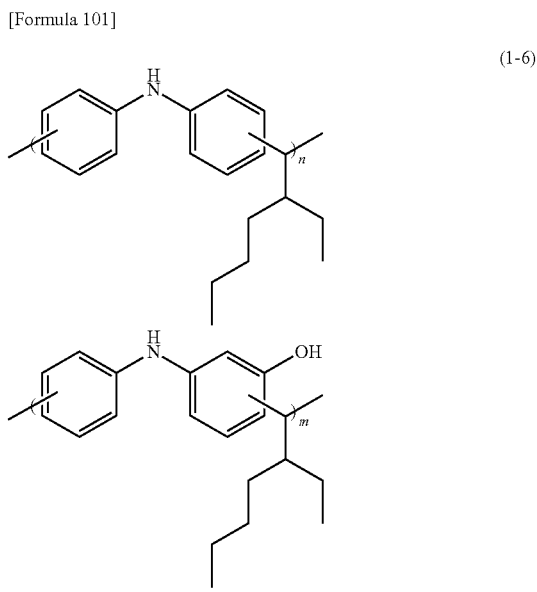

(1-6)

In a two-necked flask, 6.84 g of diphenylamine (manufactured by Kanto Chemical Co., Inc.), 7.49 g of 3-hydroxydiphenylamine (manufactured by Tokyo Chemical Industry Co., Ltd.), 10.36 g of ethylhexylaldehyde (manufactured by Tokyo Chemical Industry Co., Ltd.), 25.0 g of propylene glycol monomethyl ether acetate, and 0.31 g of methanesulfonic acid (manufactured by Tokyo Chemical Industry Co., Ltd.) were charged. The mixture was then heated to 120° C. and refluxed for approximately 5 hours while being agitated. After the completion of the reaction, the mixture was diluted with 20 g of tetrahydrofuran (manufactured by Kanto Chemical Co., Inc.), and the polymer solution was added dropwise to a mixed solvent of methanol (manufactured by Kanto Chemical Co., Inc.), ultrapure water, and 30% ammonia water (manufactured by Kanto Chemical Co., Inc.) to reprecipitate. The obtained precipitate was subjected to vacuum filtration, and the residue was dried overnight at 60° C. under reduced pressure. Thus, 23.8 g of compound 6 resin was obtained. The obtained polymer corresponded to Formulas (1-6). The weight average molecular weight Mw, measured by GPC based on calibration with polystyrene, was 10,200.

Comparative Synthesis Example 1

[Formula 102]

(2-1)

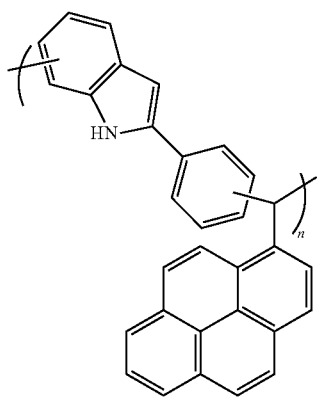

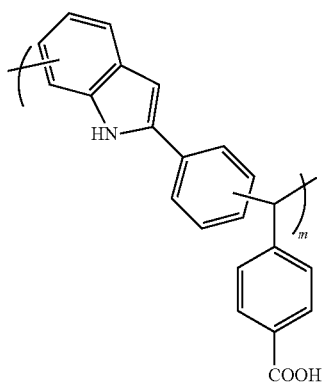

In a two-necked flask, 12.58 g of 2-phenylindole (manufactured by Tokyo Chemical Industry Co., Ltd.), 15.00 g of 1-pyrenecarboxaldehyde (manufactured by Aldrich), 0.49 g of terephthalic acid aldehyde (manufactured by Tokyo Chemical Industry Co., Ltd.), 15.02 g of propylene glycol monomethyl ether acetate, 15.02 g of N-methylpyrrolidone (manufactured by Kanto Chemical Co., Inc.), and 1.97 g of methanesulfonic acid (manufactured by Tokyo Chemical Industry Co., Ltd.) were charged. The mixture was then heated to 150° C. and refluxed for approximately 20 hours while being agitated. After the completion of the reaction, the mixture was diluted with 80.26 g of N-methylpyrrolidone. The diluted solution was added dropwise into a methanol solution to reprecipitate. The obtained precipitate was subjected to vacuum filtration, and the residue was dried overnight at 60° C. under reduced pressure. Thus, 23.3 g of compound 7 resin was obtained. The obtained polymer corresponded to Formulas (2-1). The weight average molecular weight Mw, measured by GPC based on calibration with polystyrene, was 1,300.

Comparative Synthesis Example 2

[Formula 103]

(2-2)

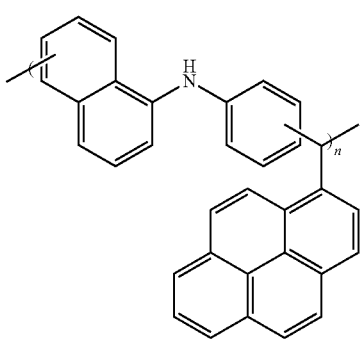

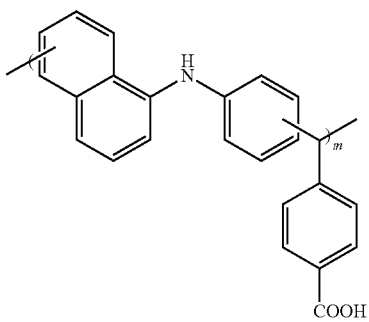

In a two-necked flask, 16.19 g of N-phenyl-1-naphthylamine (manufactured by Tokyo Chemical Industry Co., Ltd.), 17.00 g of 1-pyrenecarboxaldehyde (manufactured by Aldrich), 1.11 g of terephthalic acid aldehyde (manufactured by Tokyo Chemical Industry Co., Ltd.), 53.20 g of propylene glycol monomethyl ether acetate, 53.20 g of 1,4-dioxane (manufactured by Kanto Chemical Co., Inc.), and 1.17 g of methanesulfonic acid (manufactured by Tokyo Chemical Industry Co., Ltd.) were charged. The mixture was then heated to 150° C. and refluxed for approximately 4 hours while being agitated. After the completion of the reaction, the mixture was diluted with 29.62 g of cyclohexanone. The diluted solution was added dropwise into a methanol solution to reprecipitate. The obtained precipitate was subjected to vacuum filtration, and the residue was dried overnight at 60° C. under reduced pressure. Thus, 18.7 g of compound 8 resin was obtained. The obtained polymer corresponded to Formulas (2-2). The weight average molecular weight Mw, measured by GPC based on calibration with polystyrene, was 1,200.

Comparative Synthesis Example 3

[Formula 104]

(2-3)

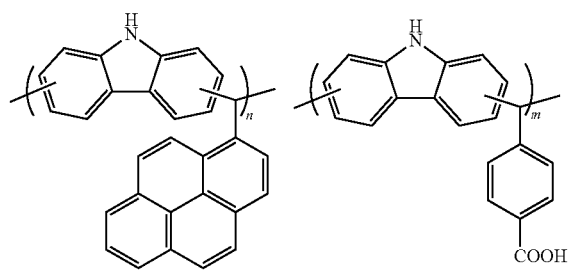

In a two-necked flask, 21.77 g of carbazole (manufactured by Tokyo Chemical Industry Co., Ltd.), 30.00 g of 1-pyrenecarboxaldehyde (manufactured by Aldrich), 1.96 g of terephthalic acid aldehyde (manufactured by Tokyo Chemical Industry Co., Ltd.), 65.89 g of propylene glycol monomethyl ether acetate, 65.89 g of 1,4-dioxane (manufactured by Kanto Chemical Co., Inc.), and 2.75 g of methanesulfonic acid (manufactured by Tokyo Chemical Industry Co., Ltd.) were charged. The mixture was then heated to 150° C. and refluxed for approximately 7 hours while being agitated. After the completion of the reaction, the mixture was diluted with 85.36 g of propylene glycol monomethyl ether acetate. The diluted solution was added dropwise into a methanol solution to reprecipitate. The obtained precipitate was subjected to vacuum filtration, and the residue was dried overnight at 60° C. under reduced pressure. Thus, 25.3 g of compound 9 resin was obtained. The obtained polymer corresponded to Formulas (2-3). The weight average molecular weight Mw, measured by GPC based on calibration with polystyrene, was 1,700.

Comparative Synthesis Example 4

[Formula 105]

(2-4)

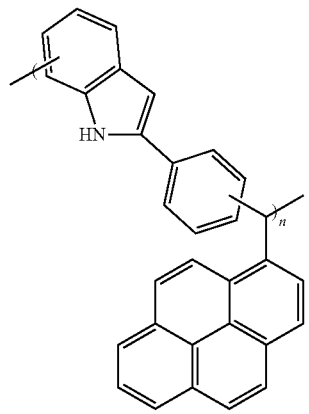

In a two-necked flask, 12.58 g of 2-phenylindole (manufactured by Tokyo Chemical Industry Co., Ltd.), 15.00 g of 1-pyrenecarboxaldehyde (manufactured by Aldrich), 0.98 g of salicylaldehyde (manufactured by Tokyo Chemical Industry Co., Ltd.), 15.31 g of propylene glycol monomethyl ether acetate, 15.31 g of N-methylpyrrolidone (manufactured by Kanto Chemical Co., Inc.), and 2.07 g of methanesulfonic acid (manufactured by Tokyo Chemical Industry Co., Ltd.) were charged. The mixture was then heated to 150° C. and refluxed for approximately 9.5 hours while being agitated. After the completion of the reaction, the mixture was diluted with 81.54 g of N-methylpyrrolidone. The diluted solution was added dropwise into a methanol solution to reprecipitate. The obtained precipitate was subjected to vacuum filtration, and the residue was dried overnight at 60° C. under reduced pressure. Thus, 22.6 g of compound 10 resin was obtained. The obtained polymer corresponded to Formulas (2-4). The weight average molecular weight Mw, measured by GPC based on calibration with polystyrene, was 1,400.

Comparative Synthesis Example 5

[Formula 106]

(2-5)

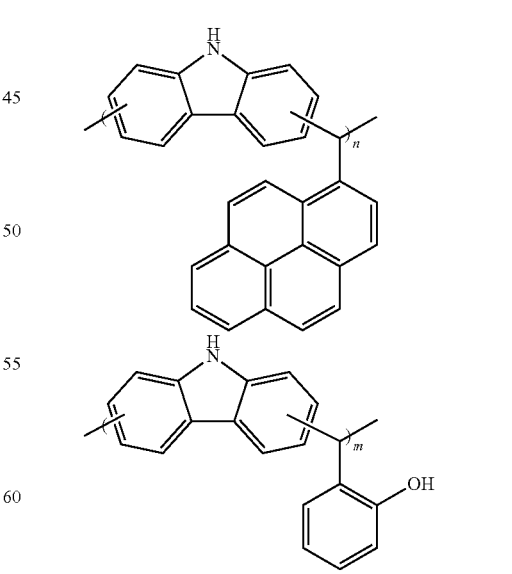

In a two-necked flask, 41.16 g of carbazole (manufactured by Tokyo Chemical Industry Co., Ltd.), 65.00 g of 1-pyrenecarboxaldehyde (manufactured by Aldrich), 6.89 g of salicylaldehyde (manufactured by Tokyo Chemical Industry Co., Ltd.), 183.47 g of propylene glycol monomethyl ether acetate, 183.47 g of 1,4-dioxane (manufactured by Kanto Chemical Co., Inc.), and 3.26 g of methanesulfonic acid (manufactured by Tokyo Chemical Industry Co., Ltd.) were charged. The mixture was then heated to 150° C. and refluxed for approximately 27.5 hours while being agitated. After the completion of the reaction, the mixture was diluted with 106.04 g of propylene glycol monomethyl ether acetate. The diluted solution was added dropwise into a methanol solution to reprecipitate. The obtained precipitate was subjected to vacuum filtration, and the residue was dried overnight at 60° C. under reduced pressure. Thus, 66.9 g of compound 11 resin was obtained. The obtained polymer corresponded to Formulas (2-5). The weight average molecular weight Mw, measured by GPC based on calibration with polystyrene, was 2,000.

Comparative Synthesis Example 6

[Formula 107]

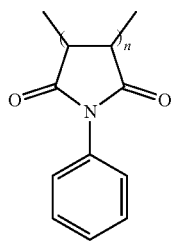

(2-6)

In a two-necked flask, 6.00 g of N-phenylmaleimide (manufactured by Tokyo Chemical Industry Co., Ltd.) and 14.00 of N-methylpyrrolidone (manufactured by Kanto Chemical Co., Inc.) were charged. The mixture was then heated to 100° C. and agitated for approximately 2 hours. After the completion of the reaction, the mixture was diluted with 10.00 g of N-methylpyrrolidone. The diluted solution was added dropwise into a methanol solution to reprecipitate. The obtained precipitate was subjected to vacuum filtration, and the residue was dried overnight at 60° C. under reduced pressure. Thus, 1.72 g of compound 12 resin was obtained. The obtained polymer corresponded to Formula (2-6). The weight average molecular weight Mw, measured by GPC based on calibration with polystyrene, was 5,700.

Reference Synthesis Example 7

[Formula 108]

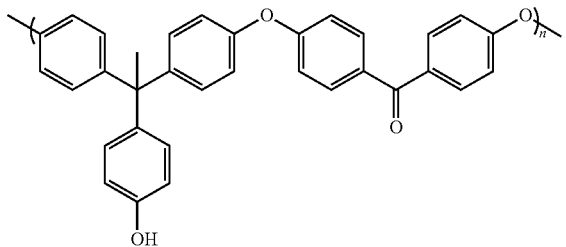

(2-7)

In a two-necked flask, 4.27 g of 4,4'-difluorobenzophenone (manufactured by Tokyo Chemical Industry Co., Ltd.), 6.00 g of 1,1,1-tris(4-hydroxyphenyl)ethane (manufactured by Tokyo Chemical Industry Co., Ltd.), 1.88 g of potassium carbonate (manufactured by Wako Pure Chemical Industries, Ltd.), and 28.36 g of N-methylpyrrolidone (manufactured by Kanto Chemical Co., Inc.) were charged. The mixture was then heated to 150° C. and agitated for approximately 4 hours. After the completion of the reaction, the mixture was diluted with 10.85 g of N-methylpyrrolidone, and potassium carbonate was removed by filtration. To the obtained filtrate, 1N—HCl was added to make the filtrate neutral, and then the solution was agitated for a while. This diluted solution was added dropwise into a methanol/water=90/10 (vol/vol) solution to reprecipitate. The obtained precipitate was subjected to vacuum filtration, and the residue was dried overnight at 60° C. under reduced pressure. Thus, 4.73 g of compound 13 resin was obtained. The obtained polymer corresponded to Formula (2-7). The weight average molecular weight Mw, measured by GPC based on calibration with polystyrene, was 1,800.

Example 1

To 5.00 g of a propylene glycol monomethyl ether acetate/3-methoxy-N,N-dimethylpropionamide=90/10 (wt/wt) solution of the resin obtained in Synthesis Example 1 (solid content: 16.11% by mass), 0.16 g of a propylene glycol monomethyl ether acetate solution containing 1% by weight of a surfactant (product name: MEGAFACE (trade name) R-40, manufactured by DIC Corporation; fluorosurfactant), 2.88 g of propylene glycol monomethyl ether acetate, and 0.0328 g of 3-methoxy-N,N-dimethylpropionamide were added. The mixture was filtered by using a microfilter made of polytetrafluoroethylene having a pore diameter of 0.1 to prepare a solution of a resist underlayer film-forming composition.

Example 2

To 5.00 g of a propylene glycol monomethyl ether acetate/N,N-dimethylisobutylamide=80/20 (wt/wt) solution of the resin obtained in Synthesis Example 2 (solid content: 18.95% by mass), 0.19 g of a propylene glycol monomethyl ether acetate solution containing 1% by weight of a surfactant (product name: MEGAFACE (trade name) R-40, manufactured by DIC Corporation; fluorosurfactant), 2.72 g of propylene glycol monomethyl ether acetate, and 0.73 g of N,N-dimethylisobutylamide were added. The mixture was filtered by using a microfilter made of polytetrafluoroethylene having a pore diameter of 0.1 µm, to prepare a solution of a resist underlayer film-forming composition.

Example 3

To 5.00 g of a propylene glycol monomethyl ether acetate/N,N-dimethylisobutylamide=80/20 (wt/wt) solution of the resin obtained in Synthesis Example 3 (solid content: 20.50% by mass), 0.21 g of a propylene glycol monomethyl ether acetate solution containing 1% by weight of a surfactant (product name: MEGAFACE (trade name) R-40, manufactured by DIC Corporation; fluorosurfactant), 3.26 g of propylene glycol monomethyl ether acetate, and 0.87 g of N,N-dimethylisobutylamide were added. The mixture was filtered by using a microfilter made of polytetrafluoroethyl-

Example 4

To 5.00 g of a propylene glycol monomethyl ether acetate/ N,N-dimethylisobutylamide=80/20 (wt/wt) solution of the resin obtained in Synthesis Example 4 (solid content: 14.23% by mass), 0.14 g of a propylene glycol monomethyl ether acetate solution containing 1% by weight of a surfactant (product name: MEGAFACE (trade name) R-40, manufactured by DIC Corporation; fluorosurfactant), 1.04 g of propylene glycol monomethyl ether acetate, and 0.30 g of N,N-dimethylisobutylamide were added. The mixture was filtered by using a microfilter made of polytetrafluoroethylene having a pore diameter of 0.1 µm, to prepare a solution of a resist underlayer film-forming composition.

Example 5

To 5.00 g of a propylene glycol monomethyl ether acetate/ N,N-dimethylisobutylamide=80/20 (wt/wt) solution of the resin obtained in Synthesis Example 5 (solid content: 15.22% by mass), 0.15 g of a propylene glycol monomethyl ether acetate solution containing 1% by weight of a surfactant (product name: MEGAFACE (trade name) R-40, manufactured by DIC Corporation; fluorosurfactant), 1.95 g of propylene glycol monomethyl ether acetate, and 0.52 g of N,N-dimethylisobutylamide were added. The mixture was filtered by using a microfilter made of polytetrafluoroethylene having a pore diameter of 0.1 µm, to prepare a solution of a resist underlayer film-forming composition.

Example 6

To 4.00 g of a propylene glycol monomethyl ether acetate solution of the resin obtained in Synthesis Example 6 (solid content: 20.8% by mass), 0.08 g of a propylene glycol monomethyl ether acetate solution containing 1% by weight of a surfactant (product name: MEGAFACE (trade name) R-40, manufactured by DIC Corporation; fluorosurfactant), 2.64 g of propylene glycol monomethyl ether acetate, and 2.52 g of N,N-dimethylisobutylamide were added. The mixture was filtered by using a microfilter made of polytetrafluoroethylene having a pore diameter of 0.1 µm, to prepare a solution of a resist underlayer film-forming composition.

Example 7

To 4.00 g of a propylene glycol monomethyl ether acetate solution of the resin obtained in Synthesis Example 6 (solid content: 20.8% by mass), 0.08 g of a propylene glycol monomethyl ether acetate solution containing 1% by weight of a surfactant (product name: MEGAFACE (trade name) R-40, manufactured by DIC Corporation; fluorosurfactant), 4.32 g of propylene glycol monomethyl ether acetate, and 0.84 g of 3-methoxy-N,N-dimethylpropionamide were added. The mixture was filtered by using a microfilter made of polytetrafluoroethylene having a pore diameter of 0.1 µm, to prepare a solution of a resist underlayer film-forming composition.

Example 8

To 4.00 g of a propylene glycol monomethyl ether acetate solution of the resin obtained in Synthesis Example 6 (solid content: 20.8% by mass), 0.08 g of a propylene glycol monomethyl ether acetate solution containing 1% by weight of a surfactant (product name: MEGAFACE (trade name) R-40, manufactured by DIC Corporation; fluorosurfactant), 3.48 g of propylene glycol monomethyl ether acetate, and 1.68 g of 3-methoxy-N,N-dimethylpropionamide were added. The mixture was filtered by using a microfilter made of polytetrafluoroethylene having a pore diameter of 0.1 µm, to prepare a solution of a resist underlayer film-forming composition.

Comparative Example 1

To 5.00 g of a propylene glycol monomethyl ether acetate solution of the resin obtained in Comparative Synthesis Example 1 (solid content: 22.27% by mass), 0.11 g of a propylene glycol monomethyl ether acetate solution containing 1% by weight of a surfactant (product name: MEGAFACE (trade name) R-40, manufactured by DIC Corporation; fluorosurfactant), 3.03 g of propylene glycol monomethyl ether acetate, and 3.01 g of propylene glycol monomethyl ether were added. The mixture was filtered by using a microfilter made of polytetrafluoroethylene having a pore diameter of 0.1 to prepare a solution of a resist underlayer film-forming composition.

Comparative Example 2

To 5.00 g of a propylene glycol monomethyl ether acetate solution of the resin obtained in Comparative Synthesis Example 2 (solid content: 18.40% by mass), 0.09 g of a propylene glycol monomethyl ether acetate solution containing 1% by weight of a surfactant (product name: MEGAFACE (trade name) R-40, manufactured by DIC Corporation; fluorosurfactant), 1.04 g of propylene glycol monomethyl ether acetate, and 2.24 g of propylene glycol monomethyl ether were added. The mixture was filtered by using a microfilter made of polytetrafluoroethylene having a pore diameter of 0.1 µm, to prepare a solution of a resist underlayer film-forming composition.

Comparative Example 3

To 5.00 g of a propylene glycol monomethyl ether acetate solution of the resin obtained in Comparative Synthesis Example 3 (solid content: 25.91% by mass), 0.13 g of a propylene glycol monomethyl ether acetate solution containing 1% by weight of a surfactant (product name: MEGAFACE (trade name) R-40, manufactured by DIC Corporation; fluorosurfactant), 2.82 g of propylene glycol monomethyl ether acetate, and 2.85 g of propylene glycol monomethyl ether were added. The mixture was filtered by using a microfilter made of polytetrafluoroethylene having a pore diameter of 0.1 µm, to prepare a solution of a resist underlayer film-forming composition.

Comparative Example 4

To 5.00 g of a propylene glycol monomethyl ether acetate solution of the resin obtained in Comparative Synthesis Example 4 (solid content: 20.78% by mass), 0.10 g of a propylene glycol monomethyl ether acetate solution containing 1% by weight of a surfactant (product name: MEGAFACE (trade name) R-40, manufactured by DIC Corporation; fluorosurfactant), 2.49 g of propylene glycol monomethyl ether acetate, and 2.81 g of propylene glycol monomethyl ether were added. The mixture was filtered by using a microfilter made of polytetrafluoroethylene having a pore diameter of 0.1 μm, to prepare a solution of a resist underlayer film-forming composition.

Comparative Example 5

To 5.00 g of a propylene glycol monomethyl ether acetate solution of the resin obtained in Comparative Synthesis Example 5 (solid content: 25.71% by mass), 0.13 g of a propylene glycol monomethyl ether acetate solution containing 1% by weight of a surfactant (product name: MEGAFACE (trade name) R-40, manufactured by DIC Corporation; fluorosurfactant), 2.76 g of propylene glycol monomethyl ether acetate, and 2.83 g of propylene glycol monomethyl ether were added. The mixture was filtered by using a microfilter made of polytetrafluoroethylene having a pore diameter of 0.1 μm, to prepare a solution of a resist underlayer film-forming composition.

Comparative Example 6

To 5.00 g of a propylene glycol monomethyl ether acetate solution of the resin obtained in Comparative Synthesis Example 6 (solid content: 16.25% by mass), 0.08 g of a propylene glycol monomethyl ether acetate solution containing 1% by weight of a surfactant (product name: MEGAFACE (trade name) R-40, manufactured by DIC Corporation; fluorosurfactant), 0.86 g of propylene glycol monomethyl ether acetate, and 2.20 g of propylene glycol monomethyl ether were added. The mixture was filtered by using a microfilter made of polytetrafluoroethylene having a pore diameter of 0.1 μm, to prepare a solution of a resist underlayer film-forming composition.

Comparative Example 7

To 4.00 g of a propylene glycol monomethyl ether acetate solution of the resin obtained in Synthesis Example 6 (solid content: 20.8% by mass), 0.08 g of a propylene glycol monomethyl ether acetate solution containing 1% by weight of a surfactant (product name: MEGAFACE (trade name) R-40, manufactured by DIC Corporation; fluorosurfactant), 4.32 g of propylene glycol monomethyl ether acetate, and 0.84 g of propylene glycol monomethyl ether were added. The mixture was filtered by using a microfilter made of polytetrafluoroethylene having a pore diameter of 0.1 μm, to prepare a solution of a resist underlayer film-forming composition.

Reference Example 8

To 5.00 g of a propylene glycol monomethyl ether acetate solution of the resin obtained in Reference Synthesis Example 7 (solid content: 24.22% by mass), 0.11 g of a propylene glycol monomethyl ether acetate solution containing 1% by weight of a surfactant (product name: MEGAFACE (trade name) R-40, manufactured by DIC Corporation; fluorosurfactant), 3.07 g of propylene glycol monomethyl ether acetate, and 3.03 g of propylene glycol monomethyl ether were added. The mixture was filtered by using a microfilter made of polytetrafluoroethylene having a pore diameter of 0.1 μm, to prepare a solution of a resist underlayer film-forming composition.

Solubility Test

Each of the polymers obtained in Synthesis Examples 1 to 6, Comparative Synthesis Examples 1 to 6, and Reference Synthesis Example 7 was mixed with a solvent to make a solution containing 30% by weight of the polymer in terms of weight ratio, and the solution was agitated for 12 hours on a mix rotor, to perform the solubility test of the polymer. The solvents used in the solubility test were propylene glycol monomethyl ether (PGME) and propylene glycol monomethyl ether acetate (PGMEA), which are often used as resist underlayer films. Additionally, in order to confirm the effect of N,N-dimethylisobutylamide (DMIB) and 3-methoxy-N,N-dimethylpropionamide (DMPA), which are amide-based solvents, the solubility test was also performed by using a mixed solvent of the amide-based solvent and the solvent described above. The ratio of the mixed solvent was PGMEA/DMIB=80/20 (wt/wt) and PGMEA/DMPA=90/10 (wt/wt) in view of the coatability. Although a polymer cannot be used as a resist underlayer film unless it is dissolved in a solvent; it was confirmed that all the polymers used in this test were soluble in any one of the solvents. The results are shown in Table 1.

TABLE 1

| | Solubility test | | | |
|---|---|---|---|---|
| | PGME | PGMEA | PGMEA/DMIB | PGMEA/DMPA |
| Synthesis Example 1 | insoluble | insoluble | insoluble | soluble |
| Synthesis Example 2 | insoluble | insoluble | soluble | soluble |
| Synthesis Example 3 | insoluble | insoluble | soluble | soluble |
| Synthesis Example 4 | insoluble | insoluble | soluble | insoluble |
| Synthesis Example 5 | insoluble | insoluble | soluble | soluble |
| Synthesis Example 6 | soluble | soluble | soluble | soluble |
| Comparative Synthesis Example 1 | insoluble | soluble | soluble | soluble |
| Comparative Synthesis Example 2 | insoluble | soluble | soluble | soluble |
| Comparative Synthesis Example 3 | insoluble | soluble | soluble | soluble |
| Comparative Synthesis Example 4 | insoluble | soluble | soluble | soluble |
| Comparative Synthesis Example 5 | insoluble | soluble | soluble | soluble |
| Comparative Synthesis Example 6 | insoluble | soluble | soluble | soluble |
| Reference Synthesis Example 7 | soluble | soluble | soluble | soluble |

Solvent Resistance Test

The solution of the resist underlayer film-forming composition prepared in each of Examples 1 to 5, Comparative Examples 1 to 7, and Reference Example 8 was coated on a silicon wafer by using a spin coater and baked at 400° C. for 90 seconds on a hot plate to form a resist underlayer film (film thickness: 0.22 μm). The baking was conducted at 300° C. for 90 seconds for Comparative Example 6 in view of the uniformity of coated surface, and at 300° C. for 60 seconds for Comparative Example 7 in view of the heat resistance. These resist underlayer films were immersed in each of ethyl lactate, propylene glycol monomethyl ether, propylene glycol monomethyl ether acetate, and cyclohexanone, which are solvents used for resists. These resist underlayer films were insoluble to these solvents.

Optical Constant Measurement

The resist underlayer film solution prepared in each of Examples 1 to 5, Comparative Examples 1 to 7, and Reference Example 8 was coated on a silicon wafer by using a spin coater and baked at 400° C. for 90 seconds on a hot plate to form a resist underlayer film (film thickness: 0.05 μm). The baking was conducted at 300° C. for 90 seconds for Comparative Example 6 in view of the uniformity of coated surface, and at 300° C. for 60 seconds for Comparative Example 7 in view of the heat resistance. The refractive index (n value) and optical absorption coefficient (k value, also referred to as attenuation coefficient) of each of these resist underlayer films were measured at a wavelength of 193 nm by using a spectroscopic ellipsometer. The results are shown in Table 2.

TABLE 2

Refractive index n and optical absorption coefficient k

| | Baking temperature | n/k 193 nm |
|---|---|---|
| Example 1 | Film baked at 400° C. | 1.51/0.62 |
| Example 2 | Film baked at 400° C. | 1.45/0.61 |
| Example 3 | Film baked at 400° C. | 1.46/0.56 |
| Example 4 | Film baked at 400° C. | 1.89/0.34 |
| Example 5 | Film baked at 400° C. | 1.54/0.73 |
| Comparative Example 1 | Film baked at 400° C. | 1.52/0.65 |
| Comparative Example 2 | Film baked at 400° C. | 1.45/0.61 |
| Comparative Example 3 | Film baked at 400° C. | 1.46/0.56 |
| Comparative Example 4 | Film baked at 400° C. | 1.52/0.64 |
| Comparative Example 5 | Film baked at 400° C. | 1.46/0.56 |
| Comparative Example 6 | Film baked at 300° C. | 1.71/0.81 |
| Comparative Example 7 | Film baked at 300° C. | 1.54/0.48 |
| Reference Example 8 | Film baked at 400° C. | 1.54/0.80 |

Measurement of Dry Etching Rate

The etcher and the etching gas used for the dry etching rate measurement were as follows.

RIE-10NR (manufactured by Samco Inc.): $CF_4$

The solution of the resist underlayer film-forming composition prepared in each of Examples 1 to 5, Comparative Examples 1 to 7, and Reference Example 8 was coated on a silicon wafer by using a spin coater and baked at 400° C. for 90 seconds on a hot plate to form a resist underlayer film (film thickness: 0.22 µm). The baking was conducted at 300° C. for 90 seconds for Comparative Example 6 in view of the uniformity of coated surface, and at 300° C. for 60 seconds for Comparative Example 7 in view of the heat resistance. The dry etching rate was measured by using a $CF_4$ gas as the etching gas, and the dry etching rate of the resist underlayer films of Examples 1 to 5, Comparative Examples 1 to 7, and Reference Example 8 was compared. The results are shown in Table 3. The rate ratio is the ratio of the dry etching rates of (resist underlayer film used in Comparative Examples and Examples)/(KrF photoresist).

TABLE 3

Dry etching rate ratio

| | Baking temperature | Etching rate |
|---|---|---|
| Example 1 | Film baked at 400° C. | 0.72 |
| Example 2 | Film baked at 400° C. | 0.73 |
| Example 3 | Film baked at 400° C. | 0.74 |
| Example 4 | Film baked at 400° C. | 1.14 |
| Example 5 | Film baked at 400° C. | 0.99 |
| Comparative Example 1 | Film baked at 400° C. | 0.76 |
| Comparative Example 2 | Film baked at 400° C. | 0.72 |
| Comparative Example 3 | Film baked at 400° C. | 0.76 |
| Comparative Example 4 | Film baked at 400° C. | 0.76 |
| Comparative Example 5 | Film baked at 400° C. | 0.75 |
| Comparative Example 6 | Film baked at 300° C. | 1.15 |
| Comparative Example 7 | Film baked at 300° C. | 0.92 |
| Reference Example 8 | Film baked at 400° C. | 0.93 |

Heat Resistance Test of Resit Underlayer Film

The solution of the resist underlayer film-forming composition prepared in each of Examples 1 to 5, Comparative Examples 1 to 7, and Reference Example 8 was coated on a silicon wafer by using a spin coater and baked at 400° C. for 90 seconds on a hot plate to form a resist underlayer film (film thickness: 0.22 µm).

Thermogravimetric analysis of the obtained film was conducted in the air by heating the film while increasing the temperature at a rate of 10° C./min from room temperature (approximately 20° C.), and the weight reduction over the passage of time was recorded. For Examples 4 and 5, Comparative Example 6, and Reference Example 8, the thermogravimetric analysis was performed while increasing the temperature at a rate of 10° C./min in a nitrogen atmosphere and maintaining the temperature for 30 minutes when the temperature reached 500° C., and the weight reduction over the passage of time was recorded. The results are shown in Table 4.

[Table 4]

TABLE 4

Weight reduction of resist underlayer film

| | 5% Weight reduction (air) (° C.) | 400° C. Weight reduction (air) (%) | 5% Weight reduction (nitrogen) (° C.) | 500° C. Weight reduction (nitrogen, maintained for 30 minutes) (%) |
|---|---|---|---|---|
| Example 1 | 442 | 2.1 | — | — |
| Example 2 | 463 | 1.4 | — | — |
| Example 3 | 426 | 3.7 | — | — |
| Example 4 | — | — | 471 | 15.4 |
| Example 5 | — | — | 500* | 16.2 |
| Comparative Example 1 | 438 | 2.7 | — | — |
| Comparative Example 2 | 454 | 1.9 | — | — |
| Comparative Example 3 | 420 | 3.8 | — | — |
| Comparative Example 4 | 437 | 2.7 | — | — |
| Comparative Example 5 | 426 | 3.5 | — | — |
| Comparative Example 6 | — | — | 454 | 24.4 |
| Comparative Example 7 | 347 | 11.7 | — | — |
| Reference Example 8 | — | — | 426 | 32.5 |

*After 200 seconds passed

Coatability Test to Stepped Substrate

In order to evaluate the step coatability, on a $SiO_2$ substrate having a film thickness of 200 nm, the coated film thicknesses at a dense pattern area (DENSE) with a trench width of 50 nm and a pitch of 100 nm and that at an open area (OPEN) with no pattern formed were compared. The resist underlayer film-forming composition prepared in each of Examples 6 to 8 and Comparative Example 7 was coated on the substrate and baked at 300° C. for 60 seconds to form a resist underlayer film. The resist underlayer film-forming composition was prepared so as to provide a film thickness of 150 nm on a solid substrate. The step coatability was observed for this substrate by using a scanning electron microscope (S-4800), manufactured by Hitachi High-Technologies Corporation. The planarization property were evaluated by measuring the difference in film thicknesses at the dense area (patterned portion) and at the open area (unpatterned portion) of the stepped substrate (the difference is the step in the coating between the dense area and the open area, and it is also referred to as "bias"). Note that the planarization means that the difference in film thickness of the coating (Iso-dense bias) above the portion having a pattern (dense area (patterned portion)) and that above the portion having no pattern (open area (unpatterned portion)) is small. Specifically, (b-a) shown in FIG. 1 is the iso-dense bias. In the drawing, a is the recess depth of the coated film above the center of the dense portion, b is the recess depth of the coated film above the center of the open portion, c is the initial depth of the area of the used stepped substrate, d is the coated film, and e is the stepped substrate. The values of the film thickness of each area and of the step in the coating are shown in Table 5. In the evaluation of the planarization property, a smaller value of the bias indicates higher planarization property.

TABLE 5

Planarization characteristics of resist underlayer film

| | DENSE Film thickness (nm) | OPEN Film thickness (nm) | DENSE/OPEN Step of the coating (nm) |
|---|---|---|---|
| Example 6 | 85 | 131 | 46 |
| Example 7 | 81 | 127 | 46 |
| Example 8 | 83 | 131 | 48 |
| Comparative Example 7 | 71 | 127 | 56 |

INDUSTRIAL APPLICABILITY

The resist underlayer film material according to the present invention achieves excellent spin coatability due to high solubility as well as exhibits high etching resistance and high heat resistance. The resulting resist underlayer film achieves excellent coatability relative to a so-called stepped substrate, achieves a small difference in film thickness after embedding, forms a flat film, and enables finer substrate processing.

The invention claimed is:
1. A resist underlayer film-forming composition comprising a polymer and a compound represented by Formula (1) as a solvent:

Formula (1)

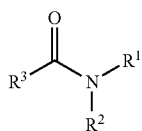

wherein, $R^1$, $R^2$, and $R^3$ in Formula (1) each independently represent a hydrogen atom or an alkyl group having 1 to 20 carbon atoms, optionally interrupted by an oxygen atom, a sulfur atom, or an amide bond, and $R^1$, $R^2$, and $R^3$ are the same or different and are optionally bonded to each other to form a ring structure,
wherein the compound represented by Formula (1) is selected from the group consisting of:

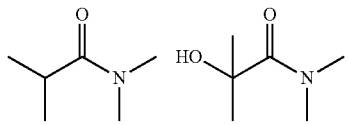

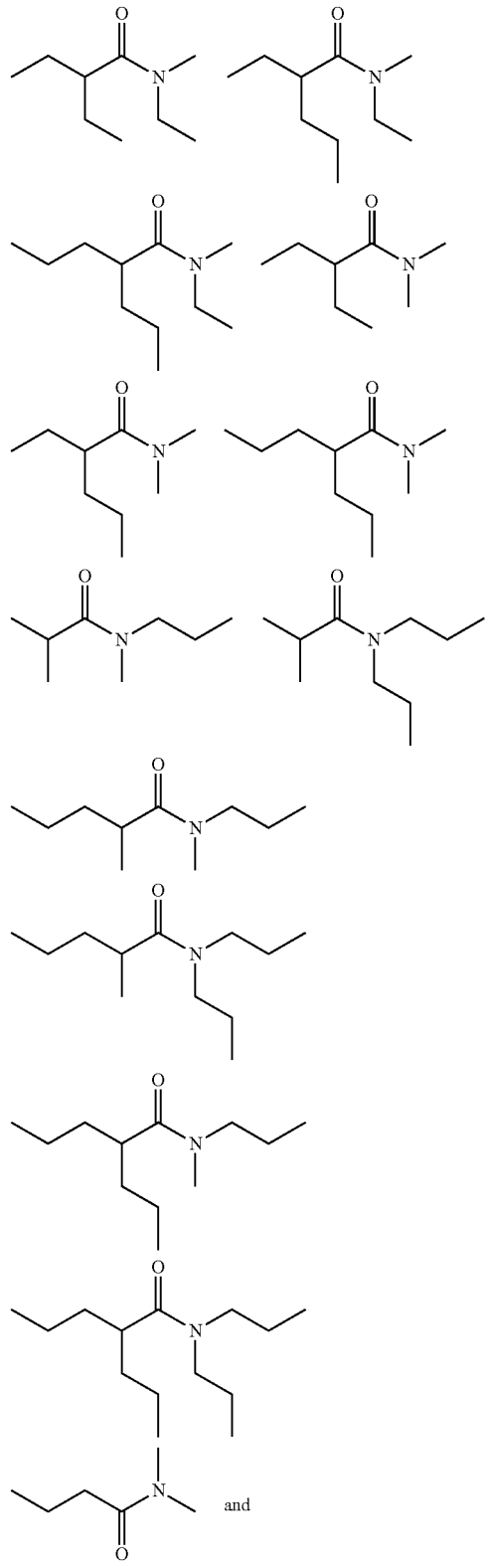

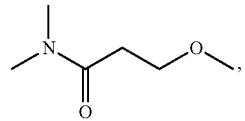

wherein the composition contains from 5% by weight to 30% by weight of the compound represented by Formula (1) relative to a total weight of the composition, and wherein the composition passes through a microfilter having a pore diameter of 0.1 μm; and wherein the polymer contains a structural unit represented by Formula (2):

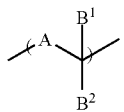

Formula (2)

wherein, in Formula (2), A represents a divalent group derived from an aromatic compound selected from the group consisting of pyridine, phenylindole, phenylnaphthylamine, diphenylamine, hydroxydiphenylamine, and carbazole, in which a hydrogen atom of the aromatic compound is optionally replaced with an alkyl group having 1 to 20 carbon atoms, a condensed ring group, a heterocyclic group, a hydroxy group, an amino group, an ether group, an alkoxy group, a cyano group, a nitro group, or a carboxyl group; $B^1$ and $B^2$ are each selected from the group consisting of a hydrogen atom, an alkyl group having 1 to 20 carbon atoms, optionally interrupted by an oxygen atom or a sulfur atom, a heterocyclic group and an aryl group having 6 to 40 carbon atoms, of which a hydrogen atom is optionally substituted, and $B^1$ and $B^2$ optionally form a ring together with a carbon atom to which $B^1$ and $B^2$ are bonded.

2. The composition according to claim 1, further comprising a crosslinking agent.

3. The composition according to claim 1, further comprising an acid and/or an acid generating agent.

4. The composition according to claim 1, wherein the composition is formulated to produce an underlayer film of an inorganic resist underlayer film.

5. A resist underlayer film, which is a baked product of a coated film formed from the resist underlayer film-forming composition according to claim 1.

6. A resist underlayer film formed by coating a resist underlayer film-forming composition on a semiconductor stepped substrate comprised of a patterned portion including a pattern and an unpatterned portion without a pattern, the unpatterned portion having a lesser thickness to thereby create a step, and wherein an iso-dense bias (difference in film thickness of the coating above the patterned portion and film thickness above the unpatterned portion) is from 3 to 50 nm;

the resist underlayer film-forming composition comprising a polymer and a compound represented by Formula (1) as a solvent:

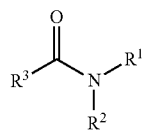

Formula (1)

wherein, $R^1$, $R^2$, and $R^3$ in Formula (1) each independently represent a hydrogen atom or an alkyl group having 1 to 20 carbon atoms, optionally interrupted by an oxygen atom, a sulfur atom, or an amide bond, and $R^1$, $R^2$, and $R^3$ are the same or different and are optionally bonded to each other to form a ring structure, wherein the composition contains from 5% by weight to 30% by weight of the compound represented by Formula (1) relative to a total weight of the composition, and wherein the composition passes through a microfilter having a pore diameter of 0.1 μm; and wherein the polymer contains a structural unit represented by Formula (2):

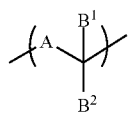

Formula (2)

wherein, in Formula (2), A represents a divalent group derived from an aromatic compound selected from the group consisting of pyridine, phenylindole, phenylnaphthylamine, diphenylamine, hydroxydiphenylamine, carbazole, N,N'-diphenylethylenediamine and N,N'-diphenyl-1,4-phenylenediamine, in which a hydrogen atom of the aromatic compound is optionally replaced with an alkyl group having 1 to 20 carbon atoms, a condensed ring group, a heterocyclic group, a hydroxy group, an amino group, an ether group, an alkoxy group, a cyano group, a nitro group, or a carboxyl group; $B^1$ and $B^2$ are each selected from the group consisting of a hydrogen atom, an alkyl group having 1 to 20 carbon atoms, optionally interrupted by an oxygen atom or a sulfur atom, a heterocyclic group and an aryl group having 6 to 40 carbon atoms, of which a hydrogen atom is optionally substituted, and $B^1$ and $B^2$ optionally form a ring together with a carbon atom to which $B^1$ and $B^2$ are bonded.

7. A resist underlayer film-forming composition comprising a polymer and 3-methoxy-N,N-dimethylpropionamide, wherein the polymer contains a structural unit represented by Formula (2):

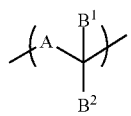

Formula (2)

wherein, in Formula (2), A represents a divalent group derived from an aromatic compound selected from the group consisting of pyridine, phenylindole, phenylnaphthylamine, diphenylamine, hydroxydiphenylamine, carbazole, N,N'-diphenylethylenediamine and N,N'-diphenyl-1,4-phenylenediamine, in which a hydrogen atom of the aromatic compound is optionally replaced with an alkyl group having 1 to 20 carbon atoms, a condensed ring group, a heterocyclic group, a hydroxy group, an amino group, an ether group, an alkoxy group, a cyano group, a nitro group, or a carboxyl group; $B^1$ and $B^2$ are each selected from the group consisting of a hydrogen atom, an alkyl group having 1 to 20 carbon atoms, optionally interrupted by an oxygen atom or a sulfur atom, a heterocyclic group and an aryl group having 6 to 40 carbon atoms, of which a hydrogen atom is optionally substituted, and $B^1$ and $B^2$ optionally form a ring together with a carbon atom to which $B^1$ and $B^2$ are bonded, wherein the composition contains from 5% by weight to 30% by weight of the 3-methoxy-N,N-dimethylpropionamide relative to a total weight of the composition, and wherein the composition passes through a microfilter having a pore diameter of 0.1 μM.

8. A resist underlayer film formed by coating the resist underlayer film-forming composition according to claim 7 on a semiconductor stepped substrate comprised of a patterned portion including a pattern and an unpatterned portion without a pattern, the unpatterned portion having a lesser thickness to thereby create a step, and wherein an iso-dense bias (difference in film thickness of the coating above the patterned portion and film thickness above the unpatterned portion) is 3 to 50 nm.

9. The composition according to claim 7, further comprising a crosslinking agent.

10. The composition according to claim 7, further comprising an acid and/or an acid generating agent.

11. The composition according to claim 7, wherein the composition is for producing an underlayer film of an inorganic resist underlayer film.

12. A resist underlayer film, which is a baked product of a coated film formed from the resist underlayer film-forming composition according to claim 7.

\* \* \* \* \*